US012801927B2

(12) United States Patent
Wang et al.

(10) Patent No.: US 12,801,927 B2
(45) Date of Patent: Nov. 17, 2026

(54) SYSTEMS AND METHODS FOR SHAPE OPTIMIZATION OF STRUCTURES USING PHYSICS INFORMED NEURAL NETWORKS

(71) Applicant: Mitsubishi Electric Research Laboratories, Inc., Cambridge, MA (US)

(72) Inventors: Bingnan Wang, Belmont, MA (US); Zhizhou Zhang, Cambridge, MA (US); Chungwei Lin, Arlington, MA (US)

(73) Assignee: Mitsubishi Electric Research Laboratories, Inc., Cambridge, MA (US)

( * ) Notice: Subject to any disclaimer, the term of this patent is extended or adjusted under 35 U.S.C. 154(b) by 449 days.

(21) Appl. No.: 18/437,524

(22) Filed: Feb. 9, 2024

(65) Prior Publication Data

US 2025/0259062 A1 Aug. 14, 2025

(51) Int. Cl.
*G06N 3/084* (2023.01)
*G06F 30/27* (2020.01)

(52) U.S. Cl.
CPC ............. *G06N 3/084* (2013.01); *G06F 30/27* (2020.01)

(58) Field of Classification Search
CPC ........ G06N 3/084; G06N 3/044; G06N 3/045; G16C 60/00; G16B 35/20; G16B 40/30;
(Continued)

(56) References Cited

U.S. PATENT DOCUMENTS 12,154,273 B1 * 11/2024 Upadhyay ............. G06T 7/0012
2020/0202059 A1 * 6/2020 Cunha ..................... G06F 30/20
(Continued)

FOREIGN PATENT DOCUMENTS

AU 2011283190 A1 * 2/2013 ............. G06F 30/23
CA 3122509 A1 * 6/2020 ............. G06N 3/045
(Continued)

OTHER PUBLICATIONS

Saviz Mowlavi and Ken Kamrin. Topology optimization with physics- informed neural networks: application to noninvasive detection of hidden geometries. arXiv preprint arXiv:2303.09280, 2023.
(Continued)

*Primary Examiner* — Steven P Sax
(74) *Attorney, Agent, or Firm* — Gene Vinokur

(57) ABSTRACT

A method for training a shape optimization neural network to produce an optimized point cloud defining desired shapes of materials with given properties is provided. The method comprises collecting a subject point cloud including points identified by their initial coordinates and material properties and jointly training a first neural network to iteratively modify a shape boundary by changing coordinates of a set of points in the subject point cloud to maximize an objective function and a second neural network to solve for physical fields by satisfying partial differential equations imposed by physics of the different materials of the subject point cloud having a shape produced by the changed coordinates output by the first neural network. The method also comprises outputting optimized coordinates of the set of points in the subject point cloud, produced by the trained first neural network.

20 Claims, 15 Drawing Sheets

(58) Field of Classification Search
CPC ........ A61B 5/4312; A61B 5/055; G03H 1/04; G03N 3/08; G06T 7/0012; G06T 17/20; G06T 7/55; G06F 30/20; G06F 30/17; G06F 30/27; G06F 30/28; G06F 30/23; G06V 20/20; G05B 19/0428; H04N 23/11; H04N 23/695
See application file for complete search history.

(56) References Cited

U.S. PATENT DOCUMENTS

| | | | | |
|---|---|---|---|---|
| 2022/0405448 | A1* | 12/2022 | Mezghanni | G06N 3/084 |
| 2023/0058169 | A1* | 2/2023 | Cella | G06F 11/3013 |
| 2023/0205133 | A1* | 6/2023 | Matusik | G03H 1/04 359/9 |
| 2024/0005514 | A1* | 1/2024 | Kaditz | A61B 5/055 |
| 2024/0061979 | A1* | 2/2024 | Baqué | G06F 30/27 |
| 2024/0065613 | A1* | 2/2024 | Kandlikar | A61B 5/4312 |
| 2024/0135259 | A1* | 4/2024 | Ahlfeld | G06F 30/17 |
| 2024/0203052 | A1* | 6/2024 | Foco | G06T 7/33 |
| 2025/0014683 | A1* | 1/2025 | McWhirter | G16B 35/20 |
| 2025/0036935 | A1* | 1/2025 | Sun | G06N 3/08 |
| 2025/0103776 | A1* | 3/2025 | Allen | G06N 3/045 |
| 2025/0139336 | A1* | 5/2025 | Suresh | G16C 60/00 |
| 2025/0146695 | A1* | 5/2025 | Mowlavi | F24F 11/64 |

FOREIGN PATENT DOCUMENTS

| | | | | | |
|---|---|---|---|---|---|
| CA | 3235394 | A1 | * | 5/2023 | G06T 7/0012 |
| CA | 2973772 | C | * | 9/2023 | H04N 23/11 |
| CN | 111161410 | A | * | 5/2020 | G06N 3/045 |
| CN | 111208759 | A | * | 5/2020 | G05B 19/0428 |
| CN | 116542164 | A | * | 8/2023 | G06F 30/27 |
| CN | 117371350 | A | * | 1/2024 | G06F 30/28 |
| CN | 117744330 | A | * | 3/2024 | |
| EP | 4040389 | A1 | * | 8/2022 | H04N 23/695 |
| WO | WO-2021050923 | A1 | * | 3/2021 | G16B 40/30 |
| WO | WO-2021067665 | A2 | * | 4/2021 | G06T 7/55 |
| WO | WO-2021178537 | A1 | * | 9/2021 | G06V 20/20 |
| WO | WO-2021198665 | A1 | * | 10/2021 | G06T 17/20 |
| WO | WO-2022241137 | A1 | * | 11/2022 | G06N 3/044 |
| WO | WO-2024035444 | A2 | * | 2/2024 | G06F 30/27 |

OTHER PUBLICATIONS

Sang-in Park, Seungjae Min, Shintaro Yamasaki, Shinji Nishiwaki, and Jeonghoon Yoo. Magnetic actuator design using level set based topology optimization. IEEE Transactions on magnetics, 44(11):4037-4040, 2008.

Ameya D Jagtap and George E Karniadakis. Extended physics-informed neural networks (xpinns): A generalized space-time domain decomposition based deep learning framework for nonlinear partial differential equations. In AAAI spring symposium: MLPS, vol. 10, 2021.

* cited by examiner

Shape

Flux Density

SYSTEMS AND METHODS FOR SHAPE OPTIMIZATION OF STRUCTURES USING PHYSICS INFORMED NEURAL NETWORKS

TECHNICAL FIELD

The present disclosure relates generally to design optimization of physical structures, and more particularly to systems, methods, and apparatuses for estimating physical parameters of such physical structures using physics informed neural networks and coordinate projection.

BACKGROUND

Optimization is the idea of altering model inputs, such as part dimensions and material properties, with the objective of improving some metric, while also considering a set of constraints. Structural optimization is a simulation-driven design technique that allows identification and exploration of high-potential designs—and reject low-potential ones—earlier in development cycles of physical structures such as products. Structural optimization techniques are used to enhance product designs and generate lightweight, manufacturable concepts. Manufacturers can also use it to refine products and validate them virtually, leading to innovative, cost-effective design solutions. Size, shape, and free-shape optimization techniques are used to fine-tune the formation of structural product concepts. By finding optimal solutions for key product characteristics like cross-sectional thickness and material choice, and by refining areas with high stress concentration, these tools reduce the risk of product failure. Shape optimization considers not just straightforward dimensional changes, but general changes in shape as well. The shape of the structure is controlled via a set of design parameters that use a set of basis functions, which can describe quite arbitrary shapes.

Structure and material shape optimization is often needed for product design across multiple disciplines. It has been a challenging research task, due to the large design space and complex underlying physics. Current classical methods are computationally expensive with intricate algorithm implementation and require a large number of numerical simulations. Accordingly low code and light-weight methods for material shape optimization that leverage the benefits of physics-informed neural networks are desired.

SUMMARY

The rapid growth of artificial intelligence is revolutionizing classical engineering society, offering novel approaches to material design and analysis. Among various scientific machine learning techniques, physics-informed neural network (PINN) has been one of the most researched subjects, for its ability to incorporate physics prior knowledge into model training. However, the intrinsic continuity requirement of PINN demands the adoption of domain decomposition when multiple materials with distinct properties exist. This greatly complicates the gradient computation of design features, limiting the application of PINN to material optimization.

It is a realization of several example embodiments that current classical methods are computationally expensive with intricate algorithm implementation, whereas the emergent physics-informed neural network (PINN) promises improvements but struggles with spatial discontinuities across varied material domains. Some example embodiments aim to address the discontinuity in physics-informed design optimization problems.

In this regard, it is also a realization of some embodiments that classical methods diverge into two paths. The first path involves defining a transition function to smooth discontinuities across domain property boundaries. This approach, while offering broad adaptability, might yield inaccurate results when subdomains have highly contrasting property values. The second path involves domain decomposition. While this ensures precise solutions regardless of property disparities, there lacks a parameterization technique that holds differentiability for the shape changing of decomposed subdomains.

Through experimentations, some example embodiments realized that in addition to its subtle performance as a partial differential equation (PDE) solver, the physics-informed training strategy shows great potential in design exploration tasks, since it converts an equation solving process into an optimization problem. Compared to traditional optimization algorithms, for instance, adjoint method-based sensitivity analysis, physics-informed design optimization is significantly more general and easier for adaptation. Some embodiments realize that some approaches towards physics-informed design optimization concentrate in two main directions.

The first direction is to establish a surrogate machine learning (ML) model that learns a response function for the entire design space, thus offering fast data screening for design search. Some embodiments are based on novel neural operator architectures that allow projection among infinite-dimensional function spaces. The input space of these architectures possesses discretization-invariance and is inherently closer to physics fields, thus achieving higher prediction accuracy when fed with sufficient data.

The second research direction focuses on direct optimization of some parameterized property fields, where training a surrogate model is oftentimes too costly for a design task with clear objectives. According to some embodiments, the design space (property field) is typically parameterized explicitly as a density field or implicitly as a level-set function. These parameterization techniques can be applied to numerous design tasks. However, some embodiments also realize that such techniques might encounter difficulties when multiple computation subdomains with large property disparity exist, particularly within PINN frameworks where neural networks exhibit infinite differentiability.

Example embodiments provided herein parameterize the property field design space through coordinate projection, in the form of a neural network. This allows the general adaptability of physics-informed design optimization to arbitrary property disparities and domain shapes while keeping the entire set of design variables (shape projection neural network) differentiable from any objective function. Some example embodiments incorporate shape projection with PINN for material design optimization. Particularly, some example embodiments provide a framework that employs neural network coordinate projection for shape optimization within PINN constructs. Such a technique allows for direct mapping from a standard shape to its optimal counterpart, optimizing the design objective without the need for traditional transition functions or the definition of intermediate material properties. The shape projection, realized through a neural network, naturally allows auto-differentiation for gradient computation without introducing intermediate transition materials. Such a framework delivers precise and efficient material design optimization and is more flexible in accommodating flexible design objectives and constraints.

Particularly, the framework proposed in several embodiments demonstrate a high degree of adaptability, allowing the incorporation of diverse constraints and objectives directly as training penalties.

In order to establish the accuracy of the proposed framework, the approach described in several example embodiments is tested in a non-limiting example use case scenarios realized through static magnetic problems for iron core design optimization—a scenario typically plagued by the high permeability contrast between materials. For example, some example embodiments optimize the shape of iron cores in 2D static magnetic fields where Maxwell's equations govern the magnetic vector potential (MVP) field A and magnetic flux density field B. The significant disparity in the relative permeability between the iron core and vacuum has been a critical challenge for the application of physics-informed design optimization. The entire optimization algorithm provided by various embodiments relies completely on physics prior knowledge without the need for external simulation results. The results highlight the framework's capability as a viable tool for shape optimization in complex material design.

It is a recognition of some example embodiments that material parameter has a discontinuity across the boundary that causes difficulties in computing optimization sensitivity if the material property of a point changes abruptly. Accordingly, a first neural network, also referred as shape neural network or shape projection neural network, of some example embodiments parameterizes the shape change by projecting initial coordinates of a set of points in a point cloud to their desired coordinates. This projection is continuous as each point's material property remain unchanged, facilitating the optimization sensitivity to fully backpropagate.

In order to achieve the aforementioned objectives, some embodiments provide a method for training a shape optimization neural network to produce an optimized point cloud defining desired shapes of materials with given properties. The shape optimization neural network includes a first neural network trained for iteratively modifying a shape boundary and thus redistributing points in the point cloud and a second neural network trained for solving for physical fields by imposing physical constraints expressed in partial differential equations, which are then used to evaluate the objective function for a given shape provided by the first neural network for each iteration. The method comprises collecting the point cloud including a set of points identified by their initial coordinates and material properties. The point cloud includes points having different material properties and points on boundaries between different materials. The method further comprises jointly training the first neural network to change the coordinates of a set of points in the point cloud (and therefore the points on the boundaries) to maximize a user-defined objection function and the second neural network to satisfy the partial differential equations imposed by the relevant physics of the different materials of the subject point cloud having a shape produced by the changed coordinates output by the first neural network. The method further comprises outputting optimized coordinates of the set of points in the point cloud produced by the trained first neural network. The optimized shapes are defined by the coordinates of the boundary points that separate point sets with different material properties.

According to some example embodiments, the first neural network describes the coordinate change of a set of points in a point cloud. In some embodiments the coordinate change is described for the points on the boundary between points with different material properties. According to some example embodiments, the second neural network predicts the physical field that obeys a set of partial differential equations.

BRIEF DESCRIPTION OF THE DRAWINGS

The presently disclosed embodiments will be further explained with reference to the following drawings. The drawings shown are not necessarily to scale, with emphasis instead generally being placed upon illustrating the principles of the presently disclosed embodiments.

Figure 1A:
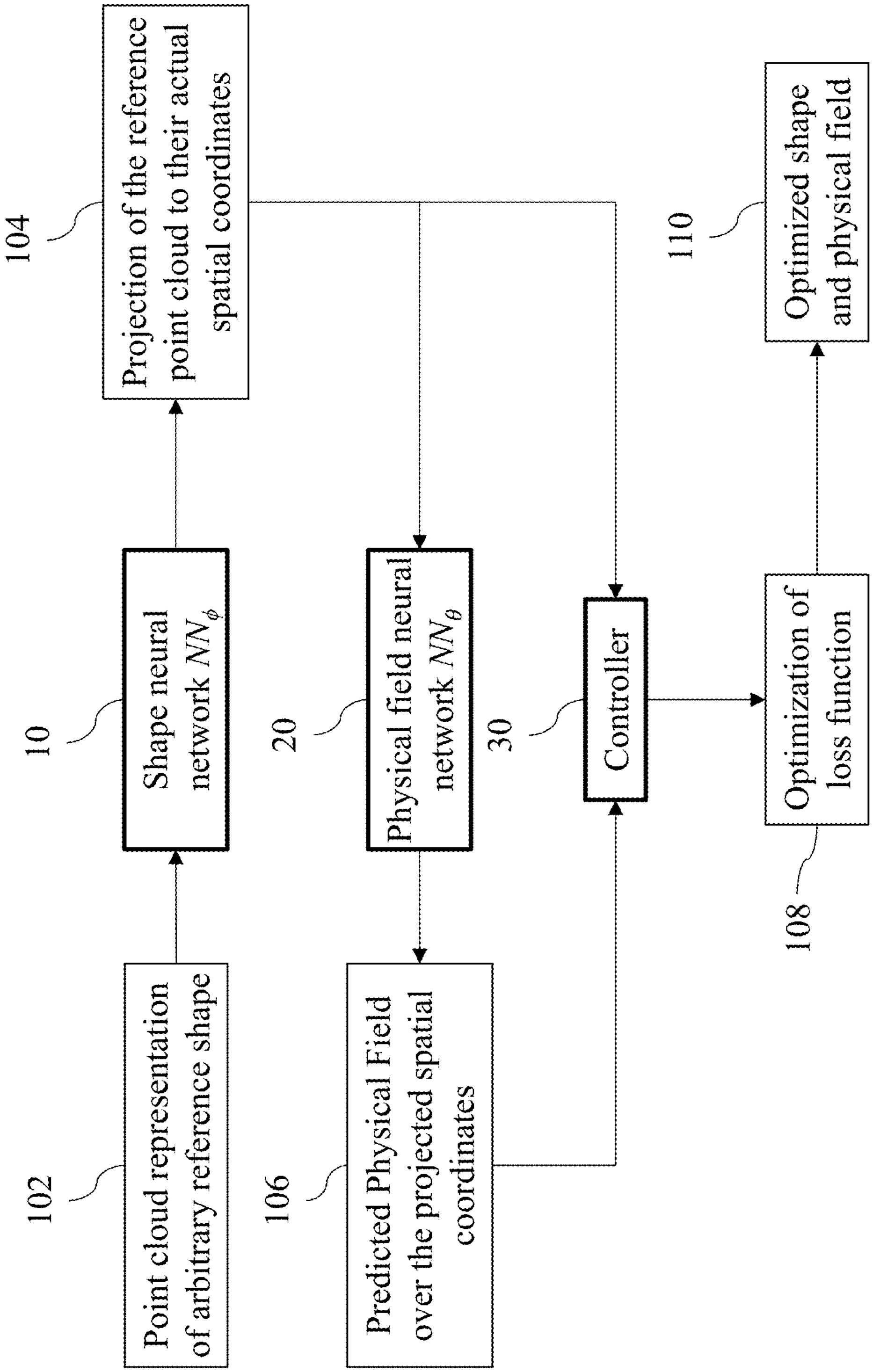
FIG. 1A illustrates a workflow of a shape optimization framework, according to some embodiments.

While the above-identified drawings set forth presently disclosed embodiments, other embodiments are also contemplated, as noted in the discussion. This disclosure presents illustrative embodiments by way of representation and not limitation. Numerous other modifications and embodiments can be devised by those skilled in the art which fall within the scope and spirit of the principles of the presently disclosed embodiments.

DETAILED DESCRIPTION

In the following description, for purposes of explanation, numerous specific details are set forth in order to provide a thorough understanding of the present disclosure. It will be apparent, however, to one skilled in the art that the present disclosure may be practiced without these specific details. In other instances, apparatuses and methods are shown in block diagram form only in order to avoid obscuring the present disclosure.

As used in this specification and claims, the terms "for example," "for instance," and "such as," and the verbs "comprising," "having," "including," and their other verb forms, when used in conjunction with a listing of one or more components or other items, are each to be construed as open ended, meaning that that the listing is not to be considered as excluding other, additional components or items. The term "based on" means at least partially based on. Further, it is to be understood that the phraseology and terminology employed herein are for the purpose of the description and should not be regarded as limiting. Any heading utilized within this description is for convenience only and has no legal or limiting effect.

Recent advances in large foundation AI models have demonstrated their potential in addressing intricate real-world challenges, consequently drawing an increasing application of AI to scientific problems such as for example, carbon capture, weather forecast, material discovery, simulation acceleration, etc. One major characteristic that distinguishes scientific problems from other AI tasks is the existence of prior knowledge. Prior knowledge can manifest in various forms in scientific problems, and may significantly enhance the performance of ML models, particularly when ground truth data is insufficient. A prime example is the incorporation of governing partial differential equations (PDEs) through PINN, into the training of ML models for predicting engineering problems.

Originally proposed as a forward solver to PDEs, PINN has been receiving growing research attention recently, for its data-free self-supervised training process. The major advantages of PINN over classical numerical methods include mesh-free representation, higher parameter efficiency in high dimensional systems, general and concise training formulation. PINN may be implemented to solve PDEs in various real-world engineering systems including solid mechanics, fluid mechanics, thermodynamics, electromagnetism, etc. However, certain drawbacks of PINN such as optimization error, intractable integral (can only be approximated), still impede its use in industry and pose the necessity of further exploration. Most importantly, it has been a realization of some embodiments that employing PINN as PDE solvers can introduce considerable computational costs, both in terms of memory space and processing time, when compared to classical numerical methods.

Despite its subtle performance as a PDE solver, physics-informed training strategy shows greater potential in design exploration tasks, as it converts an equation solving process into an optimization problem. Compared to traditional optimization algorithms, for instance adjoint method-based sensitivity analysis, physics-informed design optimization is significantly more general and easier for adaptation. Cutting-edge research progress in physics-informed design optimization concentrates mainly in two directions. The first direction is to establish a surrogate machine learning (ML) model that learns a response function for the entire design space. A well-trained surrogate model can typically accelerate the PDE solution process by at least 3-4 orders of magnitude, with negligible prediction error. Some embodiments are based on novel neural operator architectures that allow projection among infinite-dimensional function spaces. The input space of these architectures possesses discretization-invariance and is inherently closer to physics fields, thus achieving higher prediction accuracy when fed with sufficient data. On the other hand, the second research direction focuses on direct optimization of some parameterized property field, where training a surrogate model is oftentimes too costly for a design task with clear objectives. The design space (property field) is typically parameterized explicitly as a density field or implicitly as a level-set function. These parameterization techniques can be applied to numerous design tasks. However, they might encounter difficulties when dealing with subdomains that have significantly varied properties, particularly within PINN frameworks where neural networks exhibit infinite differentiability.

Example embodiments described herein aim to address the discontinuity in physics informed design optimization problems. Structural optimization is a simulation-driven design technique that allows identification and exploration of high-potential designs—and reject low-potential ones—earlier in development cycles of physical structures such as products. Structural optimization techniques are used to enhance product designs and generate lightweight, manufacturable concepts. Manufacturers can also use it to refine products and validate them virtually, leading to innovative, cost-effective design solutions. Size, shape, and free-shape optimization techniques are used to fine-tune the formation of structural product concepts. By finding optimal solutions for key product characteristics like cross-sectional thickness and material choice, and by refining areas with high stress concentration, these tools reduce the risk of product failure. Shape optimization considers not just straightforward dimensional changes, but general changes in shape as well.

Some embodiments are based on the realization that one approach in this regard involves defining a transition function to smooth discontinuities across domain property boundaries. However, some embodiments also recognize that such an approach, while offering broad adaptability, might yield inaccurate results when subdomains have highly contrasting property values. Some embodiments are also based on the realization that another approach to address the discontinuity in physics informed design optimization problems involves domain decomposition. While this ensures precise solutions regardless of property disparities, some embodiments recognized that it may result in a design objective that is non-differentiable with respect to the property field.

Accordingly, some embodiments propose to parameterize the property field design space through coordinate projection, in the form of a neural network. This allows the general adaptability of physics-informed design optimization to arbitrary property disparities and domain shapes while keeping the entire set of design variables (shape projection neural network) differentiable from any objective function.

FIG. 1A illustrates a workflow of a shape optimization framework, according to some embodiments. A point cloud representation 102 of an arbitrary reference shape is provided to a shape neural network ($NN_{\Phi}$) 10 which projects the reference cloud coordinates to their actual spatial coordinates 104 in an iterative manner. The shape neural network ($NN_\Phi$) 10 describes the coordinate change of a set of points in the point cloud 102. Particularly, the shape neural network 10 parameterizes any shape change by projecting the coordinates of sampling points from the reference shape to the actual shape. A physical field neural network ($NN_\theta$) 20 predicts the correct physical field 106 over the projected spatial coordinates 104. A controller executes the neural networks 10 and 20 utilizes the projection of the reference point cloud to their actual spatial coordinates 104 and the predicted physical field 106 to optimize a loss function defined using a combination of design objectives, shape constraints, and governing equations. In this regard, some embodiments define physics-informed loss functions on decomposed computation domains, while keeping all geometry features differentiable, including domain, boundary, and interface shapes. The loss function to be optimized in step 108 includes residuals from strong and weak form governing equations, boundary conditions, design constraints, and design objectives, whose expressions depend on the actual problem of interest. The optimization 108 of such a loss function yields the optimized shapes and the corresponding physical field at step 110, where the optimized shapes are provided as an output of the shape neural network 10 and the corresponding physical field is provided as an output of the physical field neural network 20. The optimized shapes are defined by the coordinates of the boundary points that separate point sets with different material properties.

The parameterization by the shape neural network 10 incorporates all design information within a neural network $NN_\Phi$. The contributions of physics-informed loss functions from different sources are balanced using adaptive weights learned during training phase of the neural networks. Each loss term is prefixed with adaptive weights λ. These weights are dynamically updated to maximize the overall loss, thereby placing greater emphasis on constraints that are not well met. This allows user-defined design constraints to be added effortlessly as penalty functions, without derivation of Lagrangian multipliers.

Figure 1B:
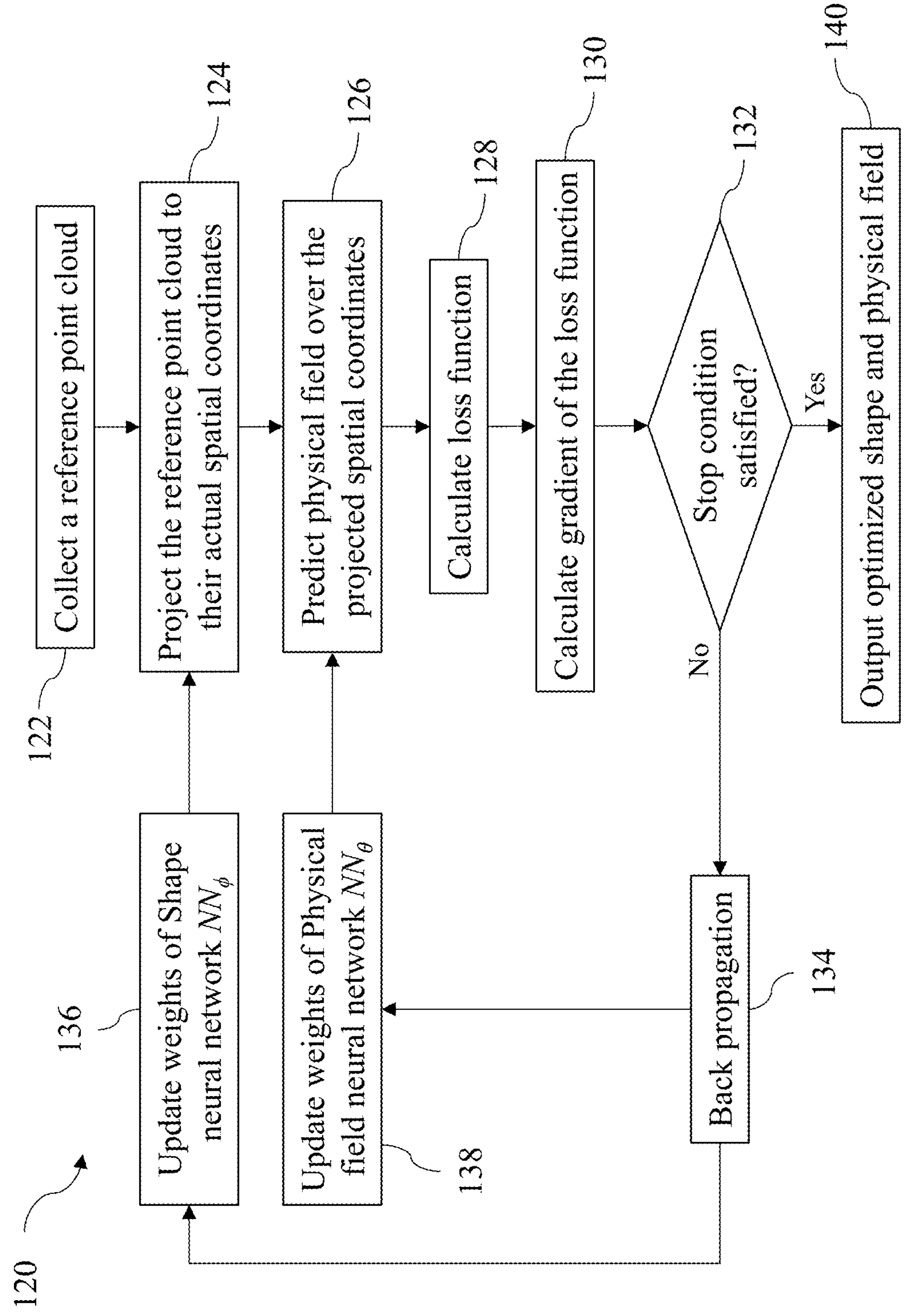
FIG. 1B illustrates a flowchart of a shape optimization method for training a shape optimization neural network, according to some example embodiments.

FIG. 1B illustrates a shape optimization method 120 for training a shape optimizing neural network, according to some embodiments. A reference point cloud (also referred to as a subject point cloud) may be collected 122 for the method 120. In this regard, some embodiments obtain the reference point cloud from a plurality of sensor measurements or from a suitable repository. The reference point cloud includes points identified by their initial coordinates in a space and material properties. At least a first subset of the points in the reference point cloud includes distinct points having different material properties and at least a second subset of the points may be on one or more boundaries between different materials. The different materials may differ from each other in terms of physical properties, dimensions, chemical properties, optical properties, and the like.

The points in the reference point cloud are projected 124 to their actual spatial coordinates by a shape neural network $NN_\Phi$. For example, as described with reference to FIG. 1A, the shape neural network $NN_\Phi$ may describe the coordinate change of at least some points in the point cloud. According to some embodiments, the coordinate change may be described for points that are common between the first subset of points and the second subset of points in the reference point cloud. Such a projection by the shape neural network $NN_\Phi$ may provide a shape produced by the changed coordinates. According to some embodiments, the shape neural network $NN_\Phi$ may change the coordinates of points on the boundaries between points having distinct material properties to maximize an objective function that expresses a training loss in terms of residuals from strong and weak form governing equations, boundary conditions, design constraints, and design objectives.

The method 120 also comprises predicting 126 the physical field of the materials in the shape produced by the changed coordinates output by the shape neural network $NN_\Phi$. In this regard, a physical field neural network ($NN_\theta$) obtains the changed coordinates from the shape neural network and solves for the physical field by imposing physical constraints expressed in partial differential equations on the shape defined by the changed coordinates.

According to some embodiments, the steps 124 and 126 may be executed as a joint step.

A loss function is calculated 128 using the changed coordinates from $NN_\Phi$ and the predicted physical field from $NN_\theta$. The individual loss components of the loss function are defined based on parameters such as residuals from strong and weak form governing equations, boundary conditions, design constraints, and design objectives. Step 128 is followed by calculation 130 of the gradient of the loss function. Each component of the loss function has a closed form expression, and at each iteration, it can be evaluated using the neural network weights. Gradient of the loss function may be calculated using any suitable technique such as the standard auto differentiation technique.

The method 120 then proceeds to check 132 if a stop condition is satisfied corresponding to the calculated gradient. The stop condition may include for example 1) a condition that the loss function is smaller than a pre-set value, 2) a condition that the gradients are smaller than pre-set values, 3) a condition that the maximum number of iterations is reached. The pre-set values for the loss function, and the gradients, and the maximum number of iterations may all be configurable values that can be defined on a case-to-case basis to achieve desired performance or design objective. If the check at 132 indicates that the stop condition is not met, the method proceeds to back propagate 134 the weights 136 and 138 of the neural networks $NN_\Phi$ and $NN_\theta$, respectively. The iteration for maximization of the loss function is then updated and steps 124-132 are repeated for the next iteration until the stop condition is met at step 132. For the iteration in which the stop condition is met, the optimized shape defined by the changed coordinates output by the shape neural network in that iteration and the physical field predicted by the physical field neural network in that iteration, are output 140 and the method 120 terminates.

Figure 1C:
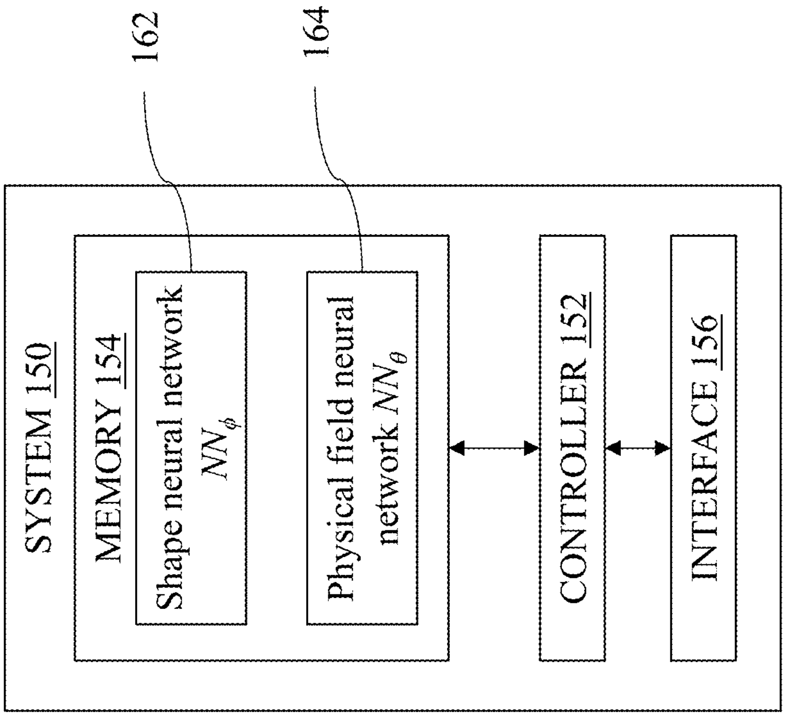
FIG. 1C illustrates some components of a system for shape optimization, according to some example embodiments.

FIG. 1C illustrates some components of a system 150 for shape optimization, according to some example embodiments. The system 150 comprises a controller 152, a memory 154, and an interface 156. The controller 152 accesses the memory 154 to execute a training process and/or a shape optimization method for the system 150. The memory 154 stores, amongst other things, a shape optimization neural network including the shape neural network 162 and a physical field neural network 164 that are invoked by the controller 152 during training and/or execution phases. The controller communicates input and output data of the system 150 through one or more interfaces 156.

Figure 1D:
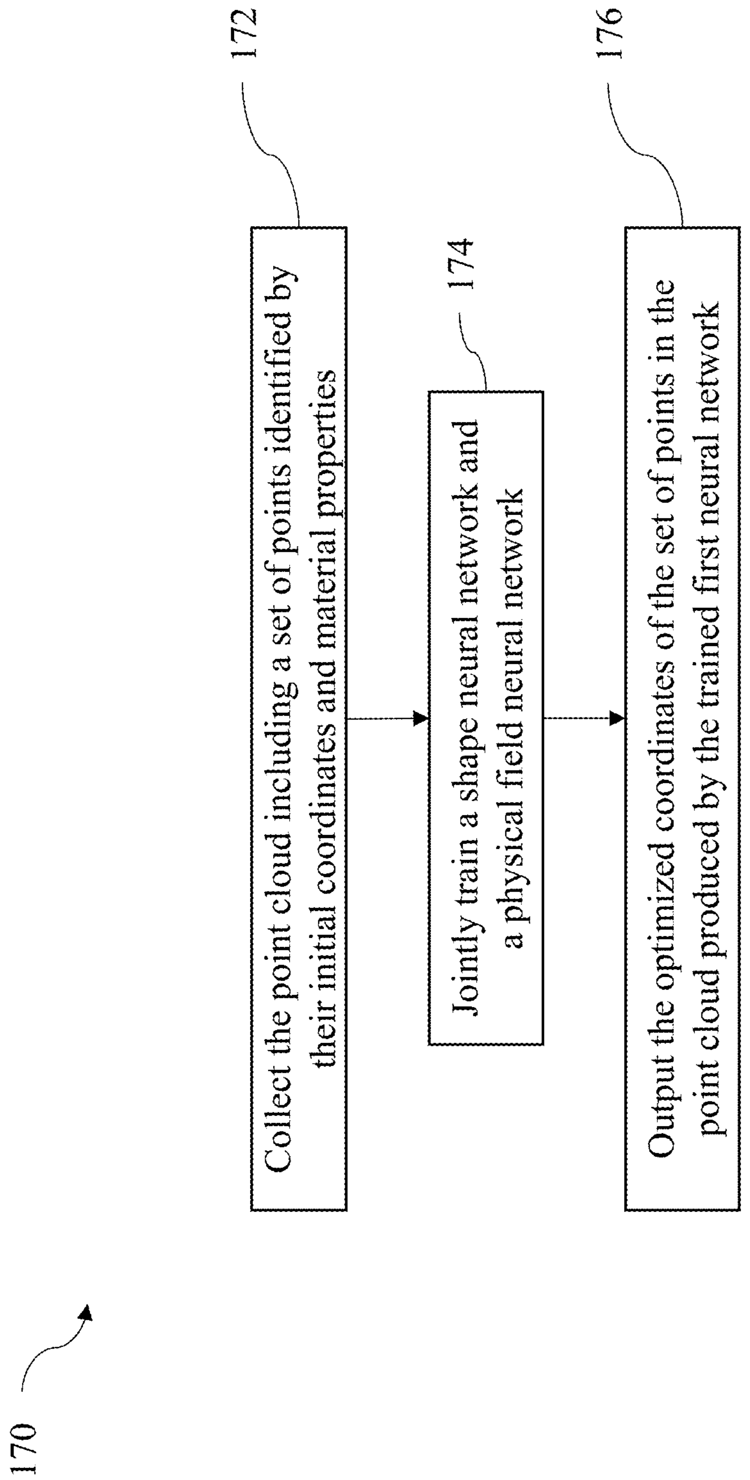
FIG. 1D illustrates some steps of a method for training a shape optimization neural network to produce a point cloud defining desired shapes of materials with given properties, according to some example embodiments.

FIG. 1D illustrates some steps of a method 170 for training a shape optimization neural network to produce a point cloud defining desired shapes of materials with given properties. The method 170 may be executed by the system 150 of FIG. 1C. The shape optimization neural network includes a shape neural network such as the neural network 10 of FIG. 1A as a first neural network. The first neural network is trained for iteratively modifying the shape boundary and thus redistributing points in the point cloud to maximize a user-defined objective function. The shape optimization neural network also includes a physical field neural network as a second neural network trained for solving for the physical fields by imposing physical constraints expressed in partial differential equations, which are used to evaluate the objective function for a given shape provided by the first neural network for each iteration of the method 170. In this regard, the method 170 comprises collecting 172 a point cloud including a set of points identified by their initial coordinates and material properties. Such a point cloud may correspond to a projection of coordinates of a reference point cloud to their actual spatial coordinates. The method also comprises jointly training 174 the first neural network and the second neural network. The joint training 174 involves training the first neural network to change the coordinates of the collected point cloud (actual shape), and therefore the points on the boundaries, in order to maximize a user-defined objection function. The joint training 174 also involves training the second neural network to satisfy the partial differential equations imposed by the relevant physics (i.e., physical constraints). The joint training causes the first neural network to learn weights assigned to individual loss components of a loss function that expresses a training loss in terms of residuals from strong and weak form governing equations, boundary conditions, design constraints, and design objectives. Since such a training loss includes physics-informed components obtained from the second neural network, learning the weights by the first neural network also leads to training of the second neural network. The trained shape optimization neural network outputs 176 the optimized coordinates of the set of points in the point cloud produced by the trained first neural network.

The efficiency, capability and performance incentives achieved by several embodiments is showcased with the aid of a few case studies.

Problem Description

As an exemplar use case, some example embodiments aim to optimize the shape of ferromagnetic iron cores for generating desired static magnetic fields. For simplicity, the two case studies are solved in 2D space with governing equations and neural network architectures described later in the disclosure.

Figure 2A:
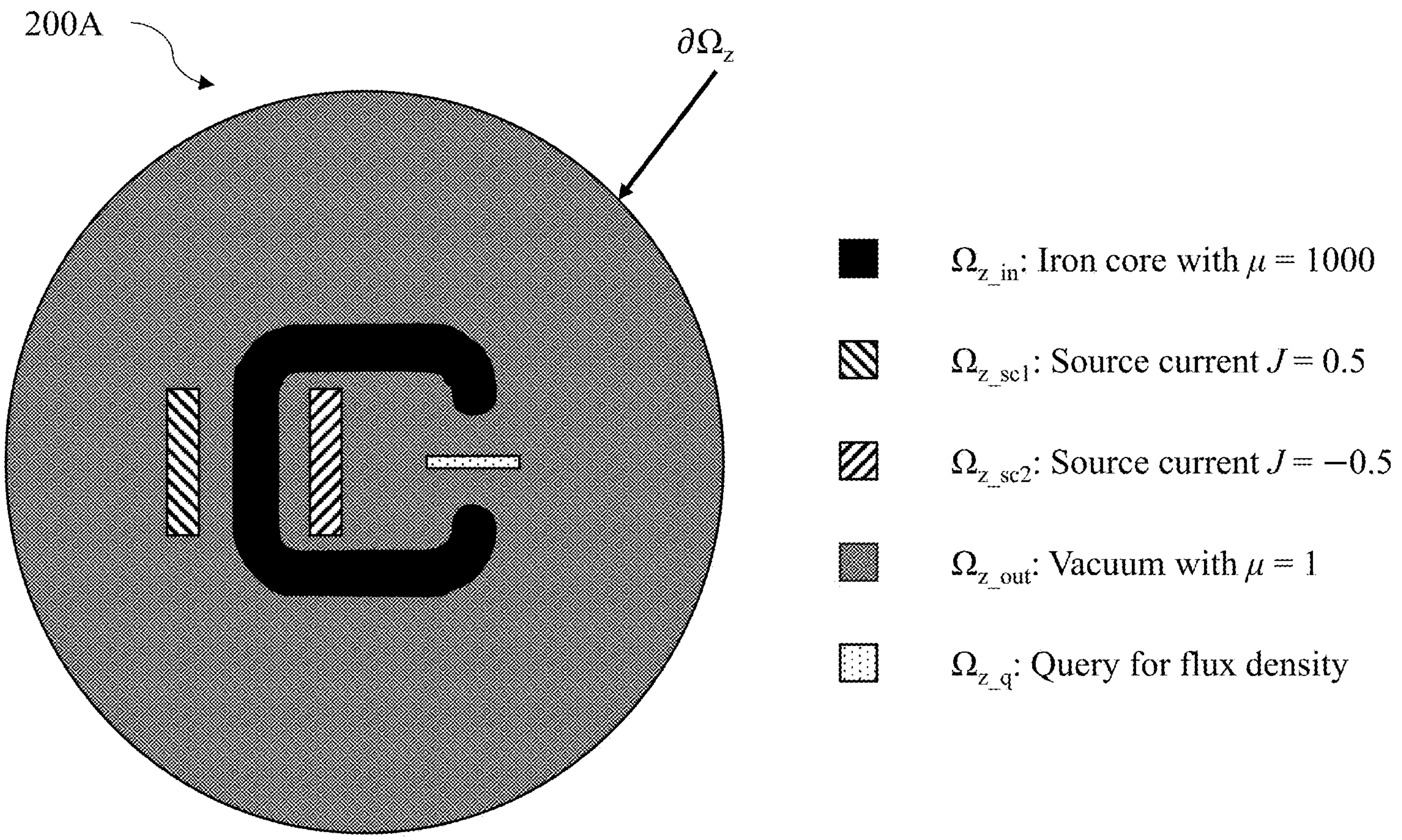
FIG. 2A illustrates the shape of a two-dimensional (2D) iron core subject to optimization for target magnetic flux density under current sources, according to some example embodiments.
Figure 2B:
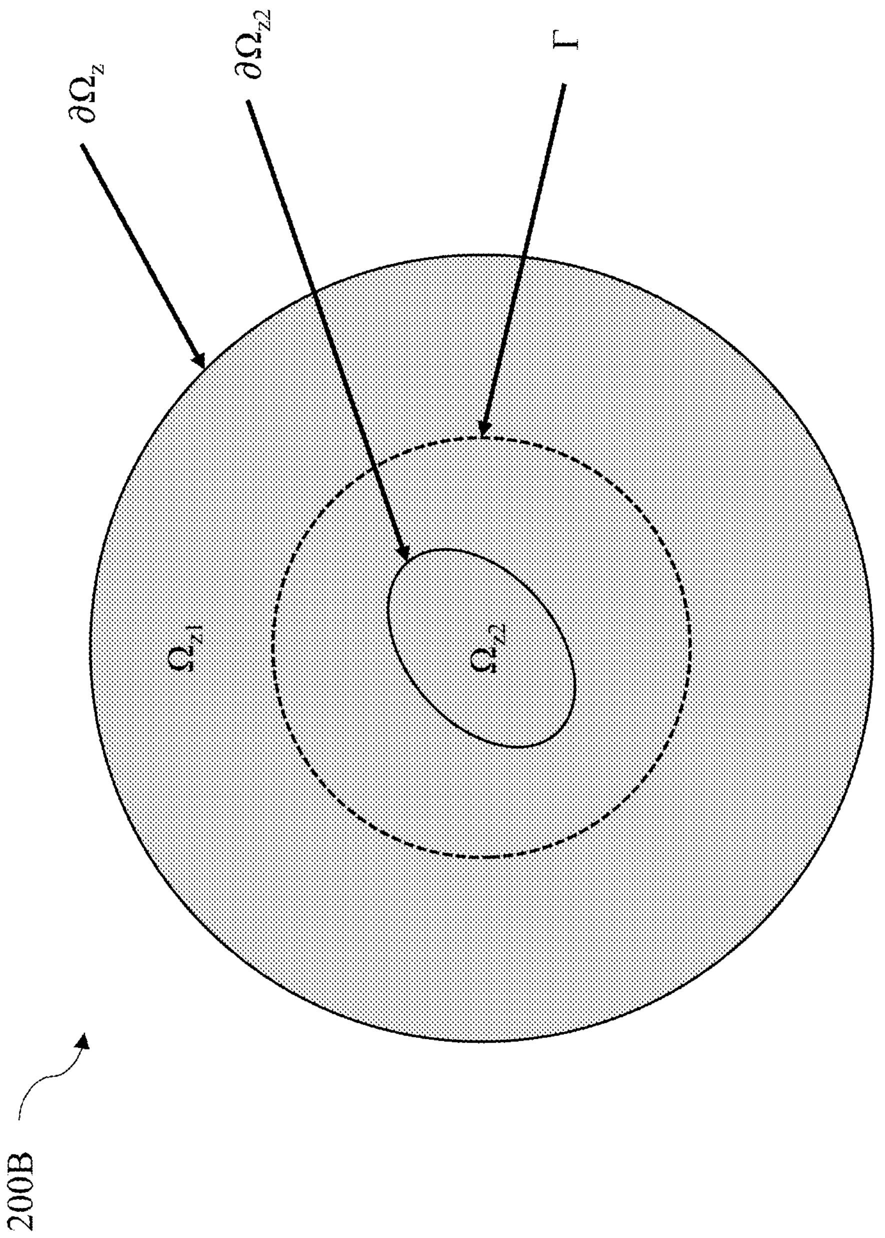
FIG. 2B illustrates the shape of a 2D iron core subject to optimization for target magnetic torque subject to constant far field magnetic flux density, according to some example embodiments.

FIGS. 2A and 2B illustrate reference domain shapes of 2D C-shape iron cores. Particularly, FIG. 2A illustrates the shape of a 2D iron core subject to optimization for target magnetic flux density under current sources while FIG. 2B illustrates the shape of a 2D iron core subject to optimization for target magnetic torque subject to constant far field magnetic flux density. Referring to FIG. 2A, the reference iron core domain $\Omega_z$ is initialized to be a C-shape with a thickness of 1 and relative permeability of 1000. When such an extreme property gap exists, according to some embodiments, the PINN with domain decomposition provides more accurate solutions compared to domain smoothing. The iron core rests in a circular vacuum domain $\Omega_z$ out of radius 8 with two current sources $\Omega_{z\_sc1}$, $\Omega_{z\_sc2}$ of density 0.5 and −0.5 on its sides. The goal is to find a projection from $\Omega_{z\_in}$ to $\Omega_{x\_in}$ that generates some desired magnetic flux density within the query domain $\Omega_{z\_q}$. It may be noted that the physical quantities listed herein are listed as dimensionless since they are not limited to any specific unit of measurement.

Referring to FIG. 2B, the reference iron core domain $\Omega_{z2}$ is initialized to be an ellipse with major axis 1.5. minor axis 0.7, and 45° inclination. The iron core rests in a circular vacuum domain $\Omega_{z1}$ of radius 8 with a uniform external magnetic flux density on boundary $\partial\Omega_z$. Given the magnetic flux density field B, the magnetic stress tensor T and magnetic torque τ may be calculated as:

$$T = \frac{1}{\mu}\left(BB^T - \frac{1}{2}I|B|^2\right) \tag{1}$$

$$\tau = \int_\Gamma r \times (Tn)dS \tag{2}$$

where I, r, n, and Γ denote the identity matrix, position vector, normal vector, and some integration trajectory.

The existence of the iron core may distort the external magnetic field, yielding a magnetic torque that can be estimated by performing the integral in Eq. 2 along any close trajectory Γ around the iron core. In this scenario, some embodiments consider infinite permeability on the iron core to examine a slightly different physics loss formulation, which yields similar solutions to any large relative permeability (e.g. μ=1000).

Shape Optimization Using PINN

Figure 3:
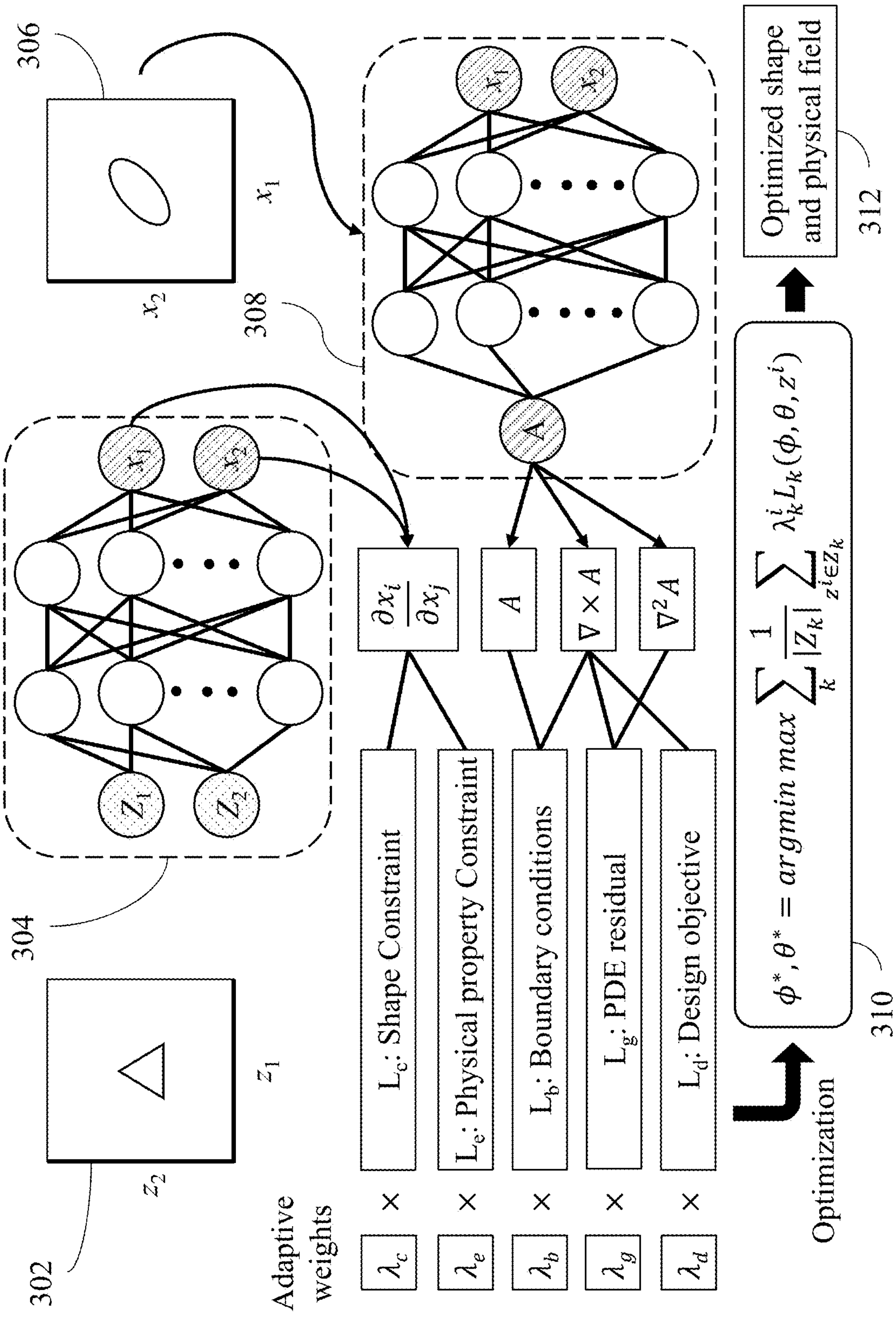
FIG. 3 illustrates an optimization framework for addressing the aforementioned case studies illustrated in FIGS. 2A and 2B.

FIG. 3 illustrates an optimization framework for addressing the aforementioned case studies illustrated in FIGS. 2A and 2B. The framework comprises a first neural network 304, also referred to as the shape neural network $NN_\phi$ and a second neural network 308, also referred to as a physical field neural network $NN_\theta$. Given a point cloud representation 302 of an arbitrary reference shape $\Omega_z$, the first neural network 304 parameterizes any shape change by projecting the reference point cloud to their actual spatial coordinates. Meanwhile, the positive Jacobian constraint is provided for the entire point cloud to preserve topology and avoid any unphysical deformation. The PINN $NN_\theta$ (308) predicts the correct physical field, specifically the MVP field in A in static magnetic problems, over the projected spatial coordinates x. Such parameterization incorporates all design information within the first neural network 304. As a result, it allows physics-informed loss functions to be defined on decomposed computation domains, while keeping all geometry features differentiable, including domain, boundary, and interface shapes.

The physics-informed shape optimization framework provided by various embodiments is completely self-contained, learning physics and searching for better designs all by itself. Therefore, the loss function is composed of multiple components including residuals from strong and weak form governing equations, boundary conditions, design constraints, and design objectives, whose expressions depend on the actual problem of interest. The training process employs self-adaptive weights to effectively balance the contributions of loss functions from different sources. Each loss term is prefixed with adaptive weights λ. These weights are dynamically updated to maximize the overall loss, thereby placing greater emphasis on constraints that are not well met. This allows user-defined design constraints to be added effortlessly as penalty functions, without derivation of Lagrangian multipliers. An optimized shape is obtained from $NN_\phi$ and the corresponding MVP field from $NN_\theta$ after the training procedure is accomplished.

Case Study One: To optimize the C-shape iron core of FIG. 2A, the MVP field neural network $NN_\theta$ and $NN_\phi$ are initialized according to the description provided next.

The governing PDEs for a static magnetic problem in 2D space can be expressed in the following general forms:

$$B = \nabla_x \times A \tag{3}$$

$$\nabla_x \times H = J \tag{4}$$

$$B = \mu H \tag{5}$$

where A is the magnetic vector potential (MVP) field, which is treated as a scalar field in 2D, and B is the magnetic flux density vector. The introduction of MVP field automatically satisfies Gauss's law requiring the divergence of B is always 0. H is the magnetic field strength vector, μ is the magnetic permeability, J is the current density, and the subscript x of the curl operator indicates the corresponding coordinate system that spatial differentiation is taken. When permeability is a constant locally, Eqns. 3, 4, 5 may be rewritten more compactly as:

$$\nabla_x^2 A = -\mu J \tag{6}$$

Alternatively, the MVP solution to a 2D static magnetic problem may be obtained using the total magnetic field energy over the entire computation domain Q, which is proven to be minimized when the weak form of Eq. 3, 4, 5 is solved:

$$\text{energy} = \int_\Omega \left(\frac{1}{2\mu}|B|^2 - JA\right) d\Omega \tag{7}$$

The training function (Eqn. 8) is then calculated on point sets sampled from the given reference domains $Z_e$, $Z_g$, $Z_{c1} \subset \Omega_z$, $Z_{c2} \subset \Omega_{z\_in}$, $Z_b$, $Z_{c3} \subset \partial\Omega_z$, $Z_{c4} \subset \Omega_{z\_sc1} \cup \Omega_{z\_sc2} \cup \Omega_{z\_q}$, and $Z_d \subset \Omega_{z\_q}$. Eq. 8 is given as:

$$L_g = |\nabla_x^2 (NN_\theta \cdot NN_\phi)(z) + \mu(z) J(z)|^2 \forall z \in Z_g$$

$$L_e = \frac{1}{|Z_e|} \sum_{z \in Z_e} \left(\frac{1}{2\mu(z)} |\nabla_x \times NN_\theta \cdot NN_\phi(z)|^2 - J(z) NN_\theta \cdot N^\wedge N_\phi(z)\right) \cdot Jac_\phi(z)$$

$$L_b = |NN_\theta \cdot NN_\phi(z)|^2 \forall z \in Z_b$$

$$L_{c1} = |ReLU(Jac_\phi(z) - 1.6) + ReLU(0.4 - Jac_\phi(z))|^2 \forall z \in Z_{c1}$$

$$L_{c2} = \left|\frac{1}{|Z_{c2}|} \sum_{z \in Z_{c2}} Jac_\phi(z) - 1\right|^2$$

$$L_{c3} = |N^\wedge N_\phi(z) - z|^2 \forall z \in Z_{c3}$$

$$L_{c4} = |N^\wedge N_\phi(z) - z|^2 \forall z \in Z_{c4}$$

$$L_d = \left|\left(\frac{1}{|Z_d|} \sum_{z \in Z_d} \nabla_x NN_\theta \cdot N^\wedge N_\phi(z) \cdot [0, 1]^T\right) - B_{target}\right|^2 = |B_q - B_{target}|^2$$

$$L = \lambda_e L_e + \lambda_d L_d + \lambda_{c2} L_{c2} + \sum_{k \in \{c1, c3, c4, b, g\}} \frac{1}{|Z_k|} \sum_{z_i \in Z_k} \lambda_k^i L_k(\phi, \theta, z^i)$$

$L_b$ in Eq. 8 represents a point-wise approximation to the strong form PDE residual (Eq. 6), and $L_e$ facilitates a Monte Carlo estimation of the magnetic energy (Eq. 7). Minimizing the strong form $L_g$ or the weak form $L_e$ would produce the same MVP field solution. However, incorporating both forms into the final loss function proves advantageous in navigating local minima, especially when seeking a continuous MVP solution on a heavily discontinuous permeability field. A Jacobian factor is multiplied to $L_e$ as the collocation points are no longer uniformly distributed on the projected spatial coordinate x. The zero potential Dirichlet boundary condition is addressed in $L_b$. $L_{c1}$ a preserves topology by constraining Jacobian, $L_{c2}$ penalizes volume change in the iron core. $L_{c3}$ and $L_{c4}$ prohibit deformation at the outer boundary, current sources, and the query region as they are not part of the design. $L_d$ is the objective function with a target value for the vertical component of the magnetic flux density in the query domain. The total training loss L is a weighted summation of the abovementioned loss components. Self-adaptive updating is utilized to automatically adjust the loss weights except for $\lambda_e$ which has a fixed value of 3.3. This is due to the fact that the minimal value of magnetic energy $L_e$ is not zero. Concurrently, to prevent any skewed designs favoring reduced energy, $\partial L_e\ \partial\phi$ is excluded from the computation graph.

As an exemplar test case, to calculate the total training loss, 35600 random collocation points are sampled over the entire domain $\Omega_z$ and shared by $Z_e$, $Z_g$, $Z_{c1}$. Another 5000 random collocation points are sampled in the reference iron core domain for $Z_{c2}$. 6000 uniform boundary points are sampled for $Z_{c3}$. 300, 300, and 66 points are sampled for $Z_{sc1}$, $Z_{sc2}$ and $Z_q$ to constrain shape change. $NN_\phi$ is first initialized to make identity prediction $z=NN_\phi(z)$ over the entire domain $\Omega_z$ through 8000 epochs of supervised training. $NN_\phi$ and $NN_\theta$ are then updated simultaneously by minimizing the complete loss function L in Eq. 8. Initial learning rates are set as 0.001 for ϕ and 0.002 for θ, where both decay exponentially by a factor of 0.9 for every 1000 epochs, with a total of 60000 epochs.

Figure 4A:
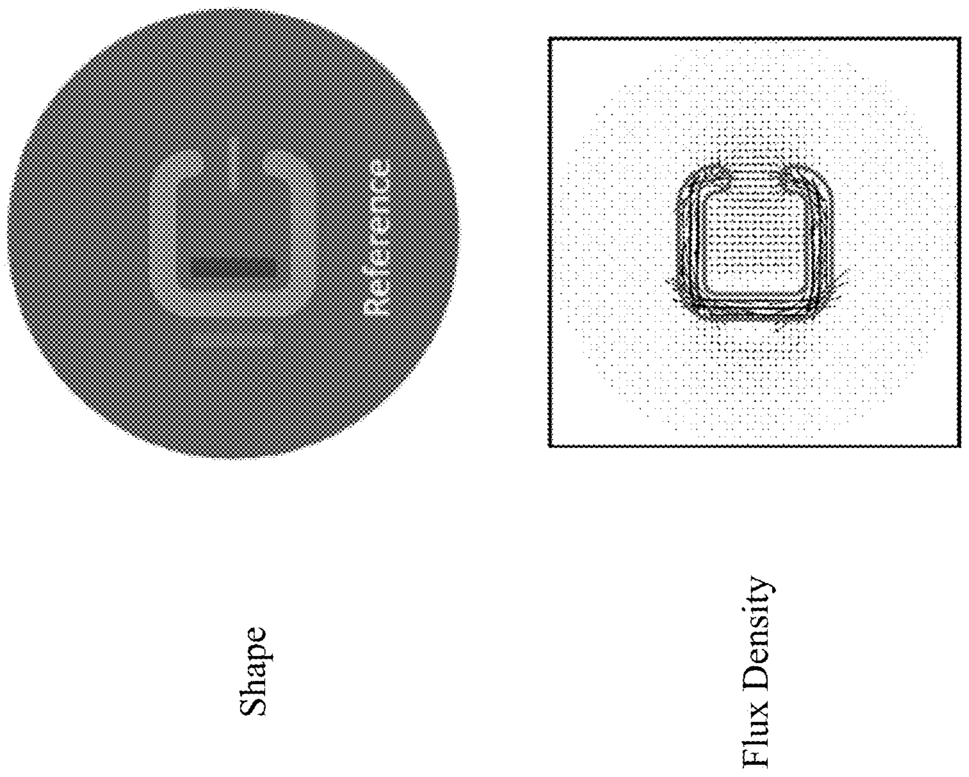
FIG. 4A illustrates a comparison of domain shape and magnetic flux density fields for the reference shape, according to some example embodiments.
Figure 4B:
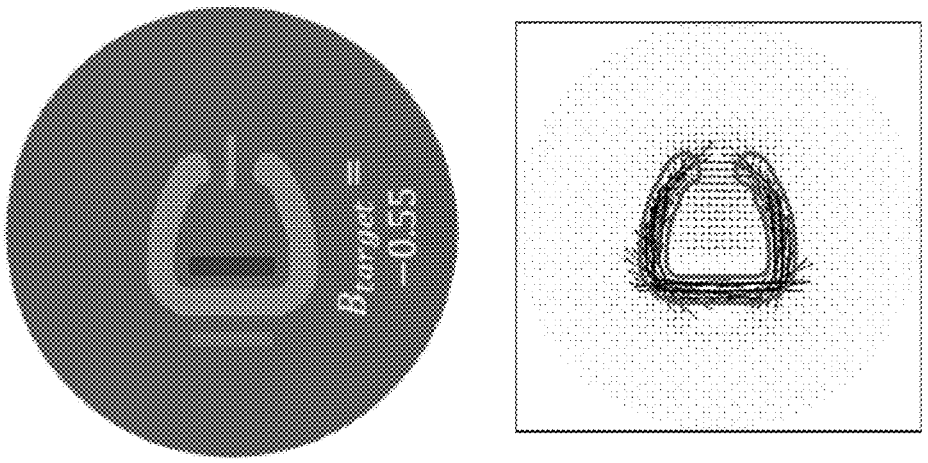
FIG. 4B illustrates a comparison of domain shape and magnetic flux density fields for an optimized iron core for $B_{target}=-0.55$, according to some example embodiments.
Figure 5A:
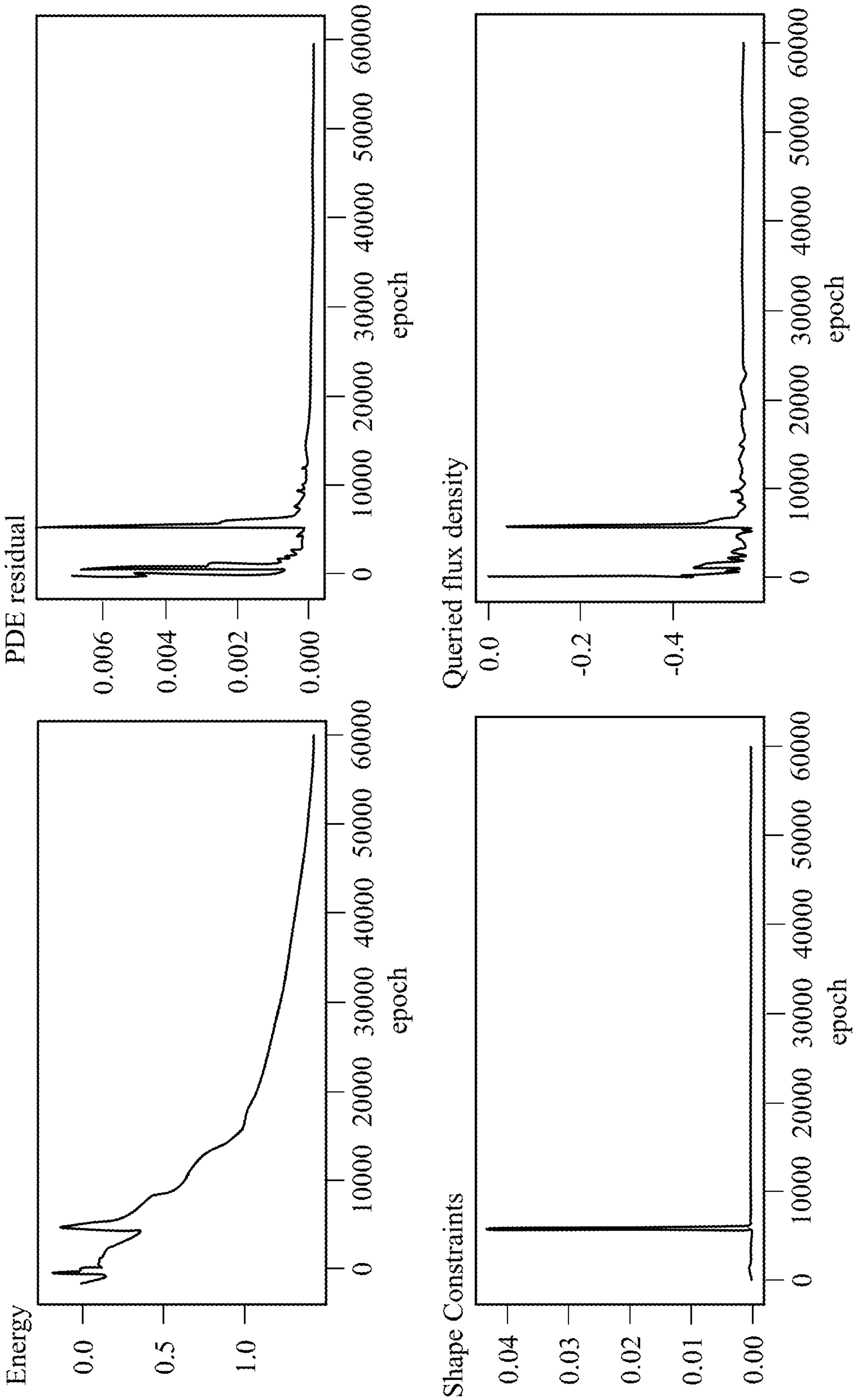
FIG. 5A illustrates training curves showing evolution of magnetic energy, PDE residual, shape constraint losses, and the queried vertical magnetic flux density over the training process of a shape optimization neural network when optimizing for a target flux density $B_{target}=-0.55$.

The proposed framework involves solving the magnetic flux density field B for the initial reference C-shape iron core by holding $NN_\phi$ to be the constant identity mapping. The solution is shown in FIG. 4A with a vertical flux density of $B_q=-0.34$ at the query region. FIG. 4B shows the optimized iron core shape projected by the trained $NN_\phi$ when the design objective is set as $B_{target}=-0.55$. It can be observed that the training process attempts to pull the iron core towards the query region to enhance the magnetic flux around the query domain. The training curves are plotted in FIG. 5A, including the evolution of magnetic energy, governing equation (PDE) residual $L_g$, shape constraint losses $L_{c1}$-$L_{c4}$, and the queried vertical magnetic flux density. All zero target constraints (including $L_d$) in the training curves converge relatively fast within 10000 epochs, whereas the remaining training process focuses on correctly resolving the physical fields by minimizing the magnetic energy.

Some embodiments are also directed towards optimizing the iron core shape by switching the design objective ($L_d$ in Eq. 8) to $L_d=-|B_q|$, aiming to directly reduce the vertical flux density within the query area. In this case, the objective function $L_d$ lacks a zero minimum. As a result, a fixed value 0.005 is assigned to $\lambda_d$, with adaptive weight update disabled. Minimizing $B_q$ without a target value makes the problem more challenging as it permits the violation of physical and shape constraints, especially with extreme $B_q$ values. To avoid exhaustive hyperparameter searching, some embodiments propose recording the training progression at every 500 epochs, subsequently selecting a suitable checkpoint model based on the observed training trends.

Figure 5B:
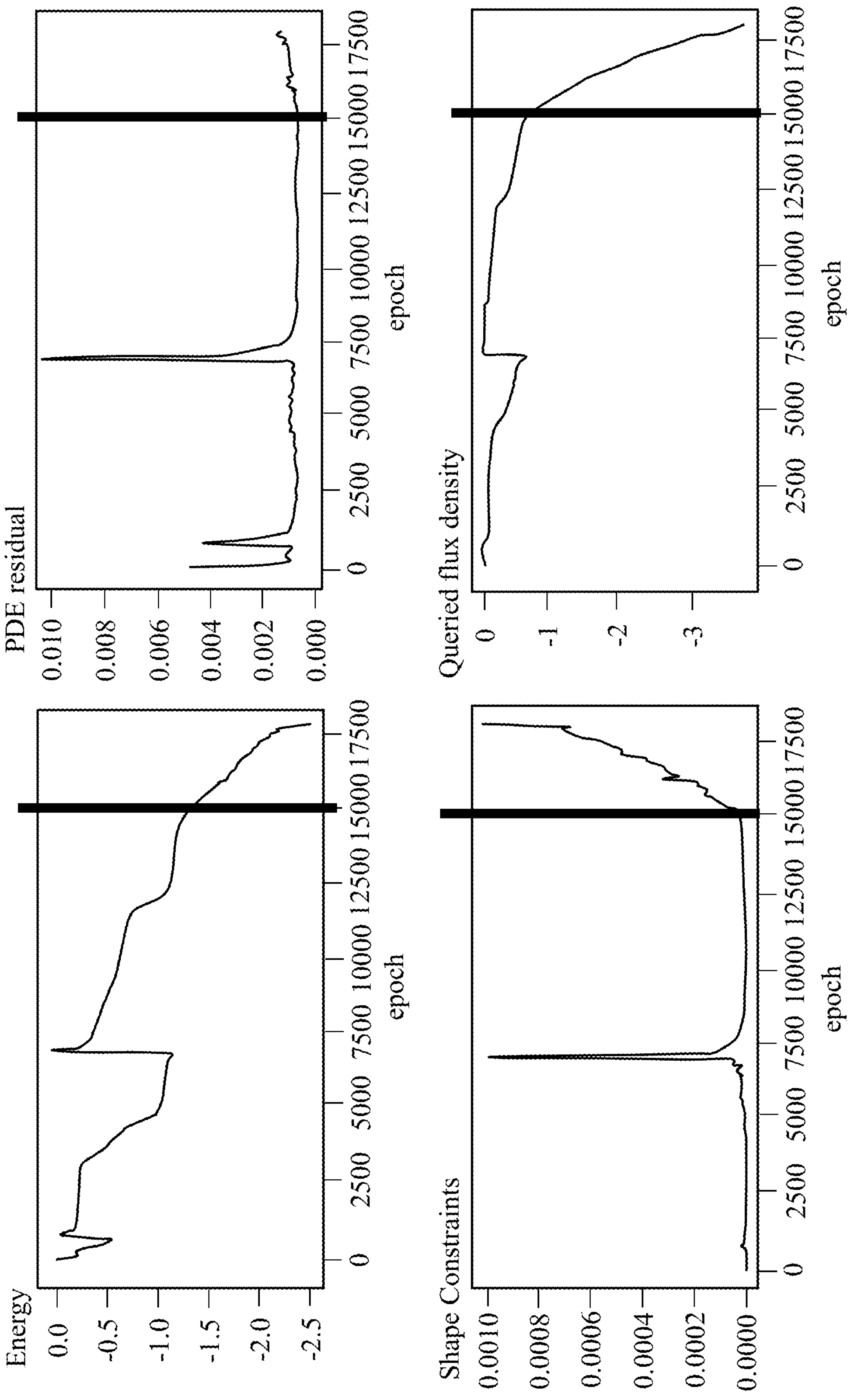
FIG. 5B illustrates training curves showing evolution of magnetic energy, PDE residual, shape constraint losses, and the queried vertical magnetic flux density over the training process of a shape optimization neural network when directly minimizing the queried vertical magnetic flux density.

FIG. 5B plots the training progress during the optimization of the iron core to achieve the minimum value of $-|B_q|$. The model from epoch 15000 (shown as thick solid line) may be selected as the checkpoint, given that it manifests the lowest energy and $B_q$ values before the shape constraints and PDE residual begin to evolve sharply. Post the 15000 epoch mark, the shape projection model, denoted as $NN_\phi$, appears to either inflate the volume of the iron core or induce unphysical shape changes (negative Jacobian). This leads to hallucinated readings for magnetic energy and flux density. The direct minimization of $-|B_q|$ enables the two neural networks to adapt more rapidly compared to the approach where a target value, $|B_q-B_{target}|^2$, is specified. This acceleration is mainly attributed to the small constant weight of 0.005 associated with the direct minimization objective function. In contrast, when a target value was present, the use of initially randomized adaptive weights takes additional epochs to rectify the physical field prediction. However, the application of adaptive weights in front of a zero-target loss can greatly alleviate the efforts required for hyperparameter tuning.

Figure 4C:
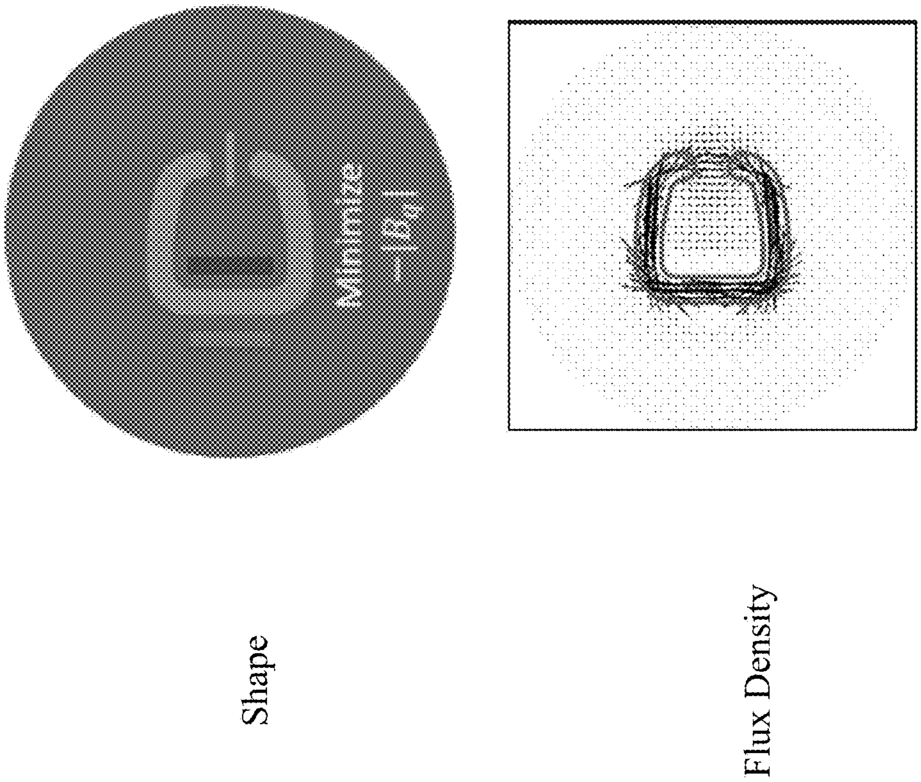
FIG. 4C illustrates a comparison of domain shape and magnetic flux density fields for an optimized iron core for maximizing magnetic flux density, according to some example embodiments.

FIG. 4C, represents the iron core's optimized shape and the corresponding predicted magnetic flux density. The deformation observed here is similar to that in FIG. 4B, but with the core tips drawn more proximate to the query region. Specifically, while FIG. 4B shows a tendency to "bend" the core tips towards the query area, FIG. 4C seems to "extend" the tips by eliminating material from other regions. Parameterizing the shape change through a coordinate projection neural network brings huge freedom to the design space and yields infinite solutions, which depend both on the form of objective function and hyperparameters, especially fixed weights $\lambda_e$ and $\lambda_d$. However, the symmetric form of $NN_\phi$ as outlined in Eq. 9 below, coupled with the penalty on positive Jacobian, prevents the algorithm from extending the iron core further towards the query domain. Particularly, the shape projection is defined to be an odd function in the vertical coordinate to enforce symmetry:

$$NN_\phi(z) = [z_1, z_2]^T + [1, 1]^T \cdot N^\wedge N_\phi(z_1, z_2) + [1, -1]^T \cdot N^\wedge N_\phi(z_1, -z_2) \quad (9)$$

Case Study Two: The magnetic torque generated by the iron core illustrated in FIG. 2B can be calculated by Eq. 1 and 2 based on the MVP field solution $NN_\theta$.

Therefore, some embodiments are directed towards finding a proper iron core shape $NN_\phi$ that generates some target magnetic torque, by minimizing a training function, given below by Eq. 10, that is calculated on point sets sampled from the reference domains $Z_g$, $Z_{c1}$, $Z_{c2} \subset \Omega_{z1}$, $Z_{b1}$, $Z_{c3} \subset \partial\Omega_z$, $Z_{b2}$, $Z_{c4} \subset \partial\Omega_{z2}$, and $X_d \subset \Gamma$:

The training function of Eq. 10 is given by:

$$L_g = \left|\nabla_x^2 (NN_\theta \cdot NN_\phi)(z) + \mu(z) J(z)\right|^2 \forall\, z \in Z_g$$

$$L_{b1} = \left|\nabla_x NN_\theta \cdot NN_\phi(z) - [0, 1]^T\right|^2 \forall\, z \in Z_{b1}$$

$$L_{b2} = \left|\nabla_x NN_\theta \cdot NN_\phi(z) \cdot t^2\right|^2 \forall\, z \in Z_{b2}$$

$$L_{c1} = |ReLU(Jac_\phi(z) - 1.6) + ReLU(0.4 - Jac_\phi(z))|^2 \forall\, z \in Z_{c1}$$

$$L_{c2} = \left|\frac{1}{|Z_{c2}|} \sum_{z \in Z_{c2}} Jac_\phi(z) - 1\right|^2$$

-continued $$L_{c3} = |NN_\phi(z) - z|^2 \forall\, z \in Z_{c3}$$

$$L_{c4} = |ReLU(\text{curve } (NN_\phi(z)) - 5|^2 \forall\, z \in Z_{c4}$$

$$L_d = \left|\sum_{x \in X_d} r(x) \times (T(x) \cdot n(x)) d - \tau_{target}\right|^2$$

$$L = \lambda_d L_d + \lambda_{c2} L_{c2} + \sum_{k \in \{c1, c3, c4, b1, b2, g\}} \frac{1}{|Z_k|} \sum_{z_i \in Z_k} \lambda_k^i L_k(\phi, \theta, z^i)$$

The governing equation residual loss $L_g$ remains the same as in Eq. 8. Since infinite permeability is considered over the iron core domain $\Omega_{z2}$ (FIG. 2B), both $NN_\phi$ and $NN_\theta$ are defined only in $\Omega_{z1}$. Therefore, Neumann boundary conditions (provided in Eq. 11 and 12 below) are needed on $\partial\Omega_{z2}$ to correctly solve the MVP field. When domain decomposition is needed, Divergence and Green's Theorem may be used to rewrite Eq. 4 and 5 as Neumann boundary conditions on the domain boundary (interface):

$$B_{left} \cdot n = B_{right} \cdot n \quad (11)$$

$$H_{left} \cdot t = H_{right} \cdot t \quad (12)$$

where the normal component of B and the tangential component of H should always remain continuous across any material boundary.

Although the magnetic flux density B isn't properly defined in a domain with infinite permeability, the tangent component of magnetic field strength H should always be 0 due to the infinite denominator as implemented in Eq. 10 $L_{b1}$. Meanwhile, the energy loss $L_e$ is no longer necessary as the entire computation domain is homogeneous. $L_{c1}$ is again added to penalize any unphysical deformation, while $L_{c2}$ conserves the total volume. $L_{c3}$ holds still the external boundary of the computation domain so that only the iron core is deformed. $L_{c4}$ penalizes any large curvature on $\partial\Omega_{z2}$ that is beyond 5. The design objective function $L_d$ computes the squared distance between the target torque and the magnetic torque which is numerically estimated on T. The total training loss L is again a weighted summation of all the loss components in Eq. 10 through the self-adaptive training scheme.

To calculate the total training loss, 30000 random collocation points are sampled within the vacuum domain $\Omega_{z1}$ and shared by $Z_g$, $Z_{c1}$, $Z_{c2}$. 6000 uniform boundary points are sampled and shared by $Z_{b1}$, $Z_{c3}$. 1250 uniform boundary points are sampled and shared by $Z_{b2}$, $Z_{c4}$. A set of 800 equally spaced query points $X_d$ is sampled along $\Gamma$ (a circle of radius 4, centered at the origin) to estimate $\tau$. Notice that $X_d$ (and $\Gamma$) is defined on the projected space x instead of the reference space z to avoid unnecessary design parameters. $NN_\phi$ is first initialized to make identity prediction $z=NN_\phi(z)$, $\forall z \in Z_g$ through 8000 epochs of supervised training. $NN_\phi$ and $NN_\theta$ are then updated simultaneously by minimizing the complete loss function L in Eq. 2. Initial learning rates are set as 0.0005 for $\phi$ and 0.005 for $\theta$, where both decay exponentially by a factor of 0.9 for every 1000 epochs, with a total of 28000 epochs.

Figure 6:
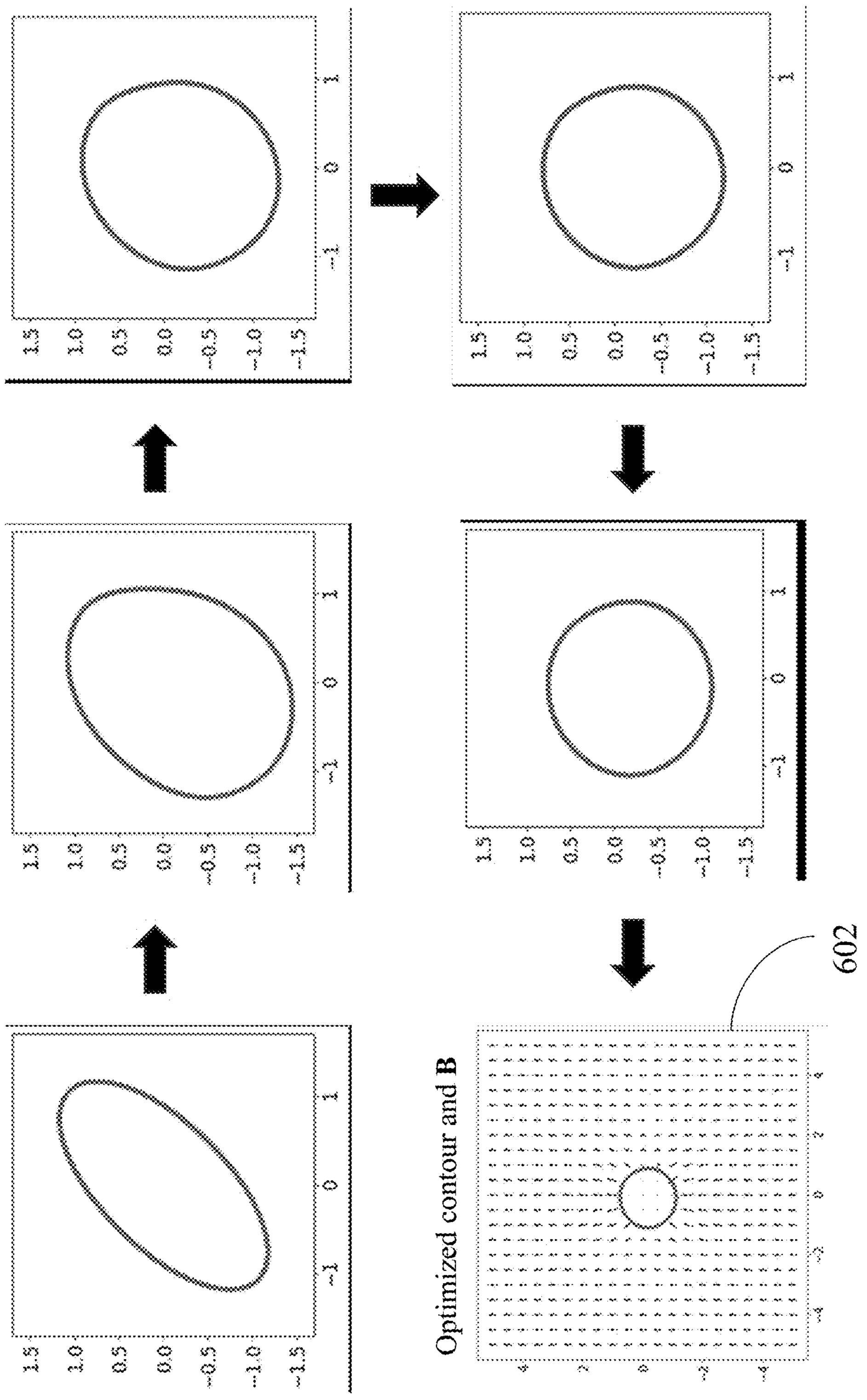
FIG. 6 illustrates evolution of the projected iron core contour over training, when target torque is set to 0.

FIG. 6 shows the evolution of $\partial\Omega_{z2}$ projected by $NN_\phi$ over the training procedure, with a zero target torque $\tau_{target}=0$. The pronounced permeability disparity between the iron core and the vacuum causes the external boundary's uniform magnetic flux density B=[0, 1]T to distort. This distortion results in the MVP field exerting a torque on the initially inclined elliptical iron core. The zero torque optimization problem technically has infinitely many solutions, including any ellipses whose main or minor axis is aligned with the external magnetic flux density. The training process eventually converges to the circular shape as shown in 602 of FIG. 6. This shape seems to be the optimization algorithm's preference for any random seed. The magnetic flux density inside of the iron core is not well-defined and is thus masked from all the plots. The final contour (projected $X_d$) may be exported and verified in COMSOL, with iron core permeability set to 1000. According to some experiments with COMSOL FEA, the optimized iron core produces a minuscule torque of 0.017, a value substantially smaller than the original torque. Thus, the shape projection parameterization method offers a versatile way to incorporate design constraints, like the curvature penalty in Eq. 10.

Figure 7:
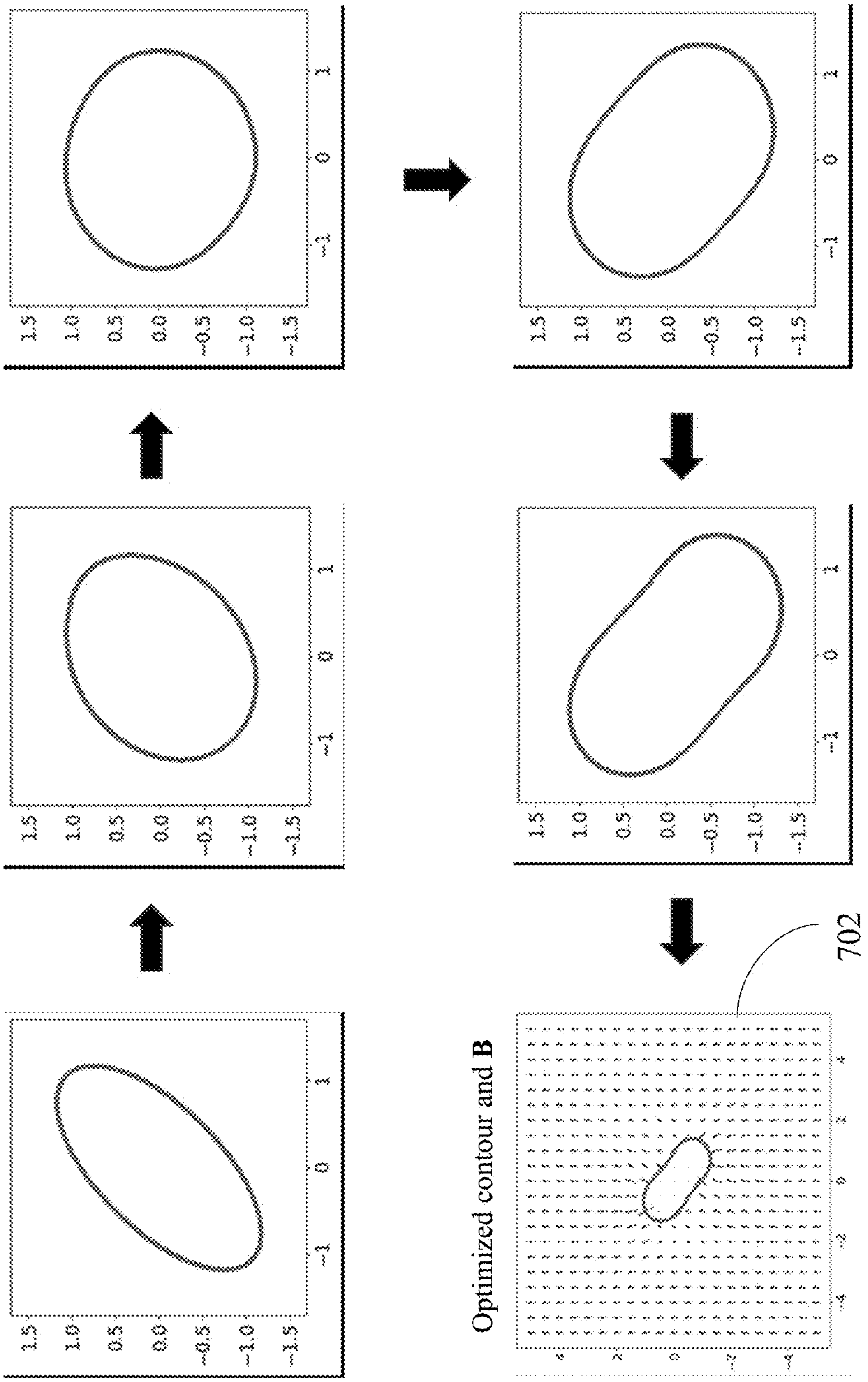
FIG. 7 illustrates evolution of the projected iron core contour over training, when target torque is set to −3.

FIG. 7 shows the evolution of $\partial\Omega_{z2}$ projected by $NN_\phi$ over the training procedure, under a different scenario with a target torque of $\tau_{target}=-3$. As the original shape generates a torque of 2.849, it may be expected that the final optimized shape is similar to the reflection of the original ellipse about the vertical axis. The training process eventually converges to the shape as shown in 702 of FIG. 7, with a peanut like shape inclined to the left. Owing to the application of Jacobian penalty $L_{c1}$ and curvature penalty $L_{c4}$, a smooth shape transition can be observed where the iron core gets compressed gradually along its main axis and then extended to the opposite direction. The magnetic flux density inside of the iron core is again masked due to infinite permeability. The final contour may be exported and verified in COMSOL, with iron core permeability set to 1000. According to some experimentations with COMSOL, the optimized iron core reports a torque of −3.105 from COMSOL FEA, agreeing well with the design objective.

Thus, example embodiments described herein address the field discontinuity challenge in physics-informed material design optimization problems by introducing the shape projection neural network $NN_\phi$. Unlike a direct shape definition through boundary curve parameterization, $NN_\phi$ parameterizes the shape in an implicit manner, thus requiring a point cloud to keep track of the reference shape. However, this approach is very beneficial in the context of physics-informed machine learning where the geometric features of all training points (including domain collocation points and boundary points) should be differentiable from an objective function. Once the reference point cloud is projected through $NN_\phi$, it is used as training points to compute the residual loss of any physics field neural network $NN_\theta$ or a design objective. The cumulative loss function is then backpropagated to correct physics ($\theta$) and shape design ($\phi$) simultaneously.

Some embodiments of the proposed framework may be applied to optimize iron core designs in two benchmark static magnetic problems: shape optimization of a C-shape iron core to generate a concentrated magnetic field in a query region subject to current sources, and shape optimization of an elliptical iron core to generate target magnetic torque subject to a uniform magnetic flux density. The shape projection method offers robust expressiveness for parameterizing a wide range of shapes with both smooth and sharp features. Also, according to some embodiments, physics can be solved with domain decomposition, eliminating the need for transition function or intermediate material properties. Furthermore, some embodiments of the shape optimization framework provide the capability of solving physics and optimizing domain shapes simultaneously, operating entirely without the need for external data. The training process described by various embodiments is time and resource efficient and accurate (validation result shows a substantial similarity with the target value). Various example embodiments also make adding custom constraints and design objectives straightforward by incorporating penalty functions, which require no extra derivations.

Various embodiments utilize neural networks to define the MVP field as $NN_\theta:\Omega_x\rightarrow R$ and the shape projection parameterization as $NN_\phi:\Omega_z\rightarrow\Omega_x$. $NN_\theta$ takes the spatial coordinate $x\in\Omega_x$ as input and predicts A. As the MVP field is always continuous over the space regardless of material properties, it is more suitable to be represented as neural networks. $NN_\phi$ takes the material coordinate $z\in\Omega_z$ as input and predicts the corresponding spatial coordinate. This projection helps define the actual optimized shape $\Omega_x$ projected from a given reference shape $\Omega_z$ through $\phi$. In the first case study, the shape projection is defined (see Eq. 9) to be an odd function in the vertical coordinate to enforce symmetry. In the second case study, the shape function is simply defined as:

$$NN_\phi(z)=[z_1,z_2]^T+N^\wedge N_\phi(z) \tag{13}$$

According to some embodiments, both $NN_\theta$ and $NN_\phi$ share the same architecture with 6 hidden layers of width 50 and the hyperbolic tangent activation. However, it may be contemplated that the architectures, layers and width for the two neural networks may be configurable as per the desired objective, and wherever possible deviations from the above-mentioned values may be possible. According to some embodiments, the training of $NN_\phi$ and $NN_\theta$ may be conducted using Pytorch and DeepXDE on an NVIDIA A40 GPU.

Figure 8:
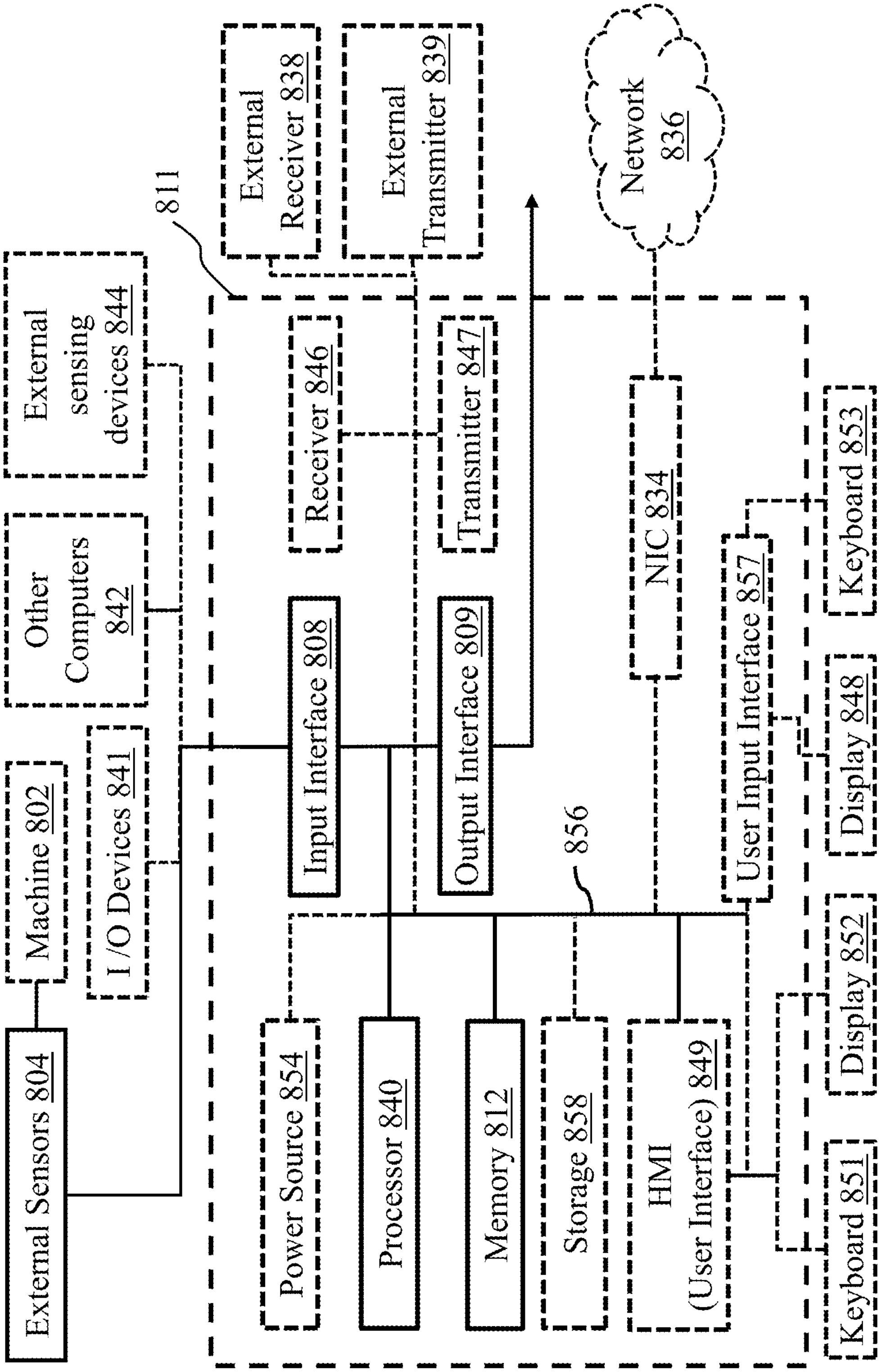
FIG. 8 illustrates a block diagram of some components of a computer system for shape optimization, according to embodiments.

FIG. 8 illustrates a block diagram of some components of a computer system for shape optimization, according to embodiments of the present disclosure. The computer 811 includes a processor 840, computer readable memory 812, storage 858 and user interface 849 with display 852 and keyboard 851, which are connected through bus 856. For example, the user interface 849 in communication with the processor 840 and the computer readable memory 812, acquires and stores the image data in the computer readable memory 812 upon receiving an input from a surface, keyboard 853 of the user interface 857 by a user.

The computer 811 can include a power source 854 and depending upon the application the power source 854 may be optionally located outside of the computer 811. Linked through bus 856 can be a user input interface 857 adapted to connect to a display device 848, wherein the display device 848 can include a computer monitor, a camera equipped display, television, projector, or mobile device, among others. A network interface controller (NIC) 834 is adapted to connect through the bus 856 to a network 836, wherein image data or other data, among other things, can be rendered on a third-party display device, third party imaging device, and/or third-party printing device outside of the computer 811.

Still referring to FIG. 8, the point cloud data or other data, among other things, may be transmitted over a communication channel of the network 836, and/or stored within the storage system 858 for storage and/or further processing. Further, the time series data or other data may be received wirelessly or hard wired from a receiver 846 (or external receiver 838) or transmitted via a transmitter 847 (or external transmitter 839) wirelessly or hard wired, the receiver

846 and transmitter 847 are both connected through the bus 856. The computer 811 may be connected via an input interface 808 to external sensing devices 844, external sensors 804, and external input/output devices 841. For example, the external sensing devices 844 and external sensors 804 may include sensors gathering data before, during, or after a process or step executed in relation to a machine 802. One or more functionalities of the system may be executed in a distributed environment and in such scenarios, the computer 811 may be connected to other external computers 842. An output interface 809 may be used to output the processed data from the processor 840. It is noted that the user interface 849 in communication with the processor 840 and the non-transitory computer readable storage medium 812, acquires and stores data in the non-transitory computer readable storage medium 812 upon receiving an input from a surface of the user interface 849 by a user. The computer 811 may also comprise a receiver 846 and a transmitter 847 to perform data communication with other devices such as an external receiver 838 and an external transmitter 839.

The description provides exemplary embodiments only, and is not intended to limit the scope, applicability, or configuration of the disclosure. Rather, the description of the exemplary embodiments intends to provide those skilled in the art with an enabling description for implementing one or more exemplary embodiments. Contemplated are various changes that may be made in the function and arrangement of elements without departing from the spirit and scope of the subject matter disclosed as set forth in the appended claims.

Specific details are given in the following description to provide a thorough understanding of the embodiments. However, understood by one of ordinary skill in the art can be that the embodiments may be practiced without these specific details. For example, systems, processes, and other elements in the subject matter disclosed may be shown as components in block diagram form in order not to obscure the embodiments in unnecessary detail. In other instances, well-known processes, structures, and techniques may be shown without unnecessary detail in order to avoid obscuring the embodiments. Further, like reference numbers and designations in the various drawings indicated like elements.

Also, individual embodiments may be described as a process which is depicted as a flowchart, a flow diagram, a data flow diagram, a structure diagram, or a block diagram. Although a flowchart may describe the operations as a sequential process, many of the operations can be performed in parallel or concurrently. In addition, the order of the operations may be re-arranged. A process may be terminated when its operations are completed but may have additional steps not discussed or included in a figure. Furthermore, not all operations in any particularly described process may occur in all embodiments. A process may correspond to a method, a function, a procedure, a subroutine, a subprogram, etc. When a process corresponds to a function, the function's termination can correspond to a return of the function to the calling function or the main function.

Furthermore, embodiments of the subject matter disclosed may be implemented, at least in part, either manually or automatically. Manual or automatic implementations may be executed, or at least assisted, through the use of machines, hardware, software, firmware, middleware, microcode, hardware description languages, or any combination thereof. When implemented in software, firmware, middleware or microcode, the program code or code segments to perform the necessary tasks may be stored in a machine-readable medium. A processor(s) may perform the necessary tasks.

Various methods or processes outlined herein may be coded as software that is executable on one or more processors that employ any one of a variety of operating systems or platforms. Additionally, such software may be written using any of a number of suitable programming languages and/or programming or scripting tools, and also may be compiled as executable machine language code or intermediate code that is executed on a framework or virtual machine. Typically, the functionality of the program modules may be combined or distributed as desired in various embodiments.

Embodiments of the present disclosure may be embodied as a method, of which an example has been provided. The acts performed as part of the method may be ordered in any suitable way. Accordingly, embodiments may be constructed in which acts are performed in an order different than illustrated, which may include performing some acts concurrently, even though shown as sequential acts in illustrative embodiments.

Further, embodiments of the present disclosure and the functional operations described in this specification can be implemented in digital electronic circuitry, in tangibly embodied computer software or firmware, in computer hardware, including the structures disclosed in this specification and their structural equivalents, or in combinations of one or more of them. Further some embodiments of the present disclosure can be implemented as one or more computer programs, i.e., one or more modules of computer program instructions encoded on a tangible non transitory program carrier for execution by, or to control the operation of, data processing apparatus. The computer storage medium can be a machine-readable storage device, a machine-readable storage substrate, a random or serial access memory device, or a combination of one or more of them.

A computer program (which may also be referred to or described as a program, software, a software application, a module, a software module, a script, or code) can be written in any form of programming language, including compiled or interpreted languages, or declarative or procedural languages, and it can be deployed in any form, including as a stand-alone program or as a module, component, subroutine, or other unit suitable for use in a computing environment. A computer program may, but need not, correspond to a file in a file system. A program can be stored in a portion of a file that holds other programs or data, e.g., one or more scripts stored in a markup language document, in a single file dedicated to the program in question, or in multiple coordinated files, e.g., files that store one or more modules, sub programs, or portions of code.

A computer program can be deployed to be executed on one computer or on multiple computers that are located at one site or distributed across multiple sites and interconnected by a communication network. Computers suitable for the execution of a computer program include, by way of example, can be based on general or special purpose microprocessors or both, or any other kind of central processing unit. Generally, a central processing unit will receive instructions and data from a read only memory or a random-access memory or both. The essential elements of a computer are a central processing unit for performing or executing instructions and one or more memory devices for storing instructions and data. Generally, a computer will also include, or be operatively coupled to receive data from or transfer data to, or both, one or more mass storage devices for storing data, e.g., magnetic, magneto optical disks, or optical disks. However, a computer need not have such devices.

To provide for interaction with a user, embodiments of the subject matter described in this specification can be implemented on a computer having a display device, e.g., a CRT (cathode ray tube) or LCD (liquid crystal display) monitor, for displaying information to the user and a keyboard and a pointing device, e.g., a mouse or a trackball, by which the user can provide input to the computer. Other kinds of devices can be used to provide for interaction with a user as well; for example, feedback provided to the user can be any form of sensory feedback, e.g., visual feedback, auditory feedback, or tactile feedback; and input from the user can be received in any form, including acoustic, speech, or tactile input. In addition, a computer can interact with a user by sending documents to and receiving documents from a device that is used by the user; for example, by sending web pages to a web browser on a user's client device in response to requests received from the web browser.

Embodiments of the subject matter described in this specification can be implemented in a computing system that includes a back end component, e.g., as a data server, or that includes a middleware component, e.g., an application server, or that includes a front end component, e.g., a client computer having a graphical user interface or a Web browser through which a user can interact with an implementation of the subject matter described in this specification, or any combination of one or more such back end, middleware, or front end components. The components of the system can be interconnected by any form or medium of digital data communication, e.g., a communication network. Examples of communication networks include a local area network ("LAN") and a wide area network ("WAN"), e.g., the Internet.

The computing system can include clients and servers. A client and server are generally remote from each other and typically interact through a communication network. The relationship of client and server arises by virtue of computer programs running on the respective computers and having a client-server relationship with each other.

Although the present disclosure has been described with reference to certain preferred embodiments, it is to be understood that various other adaptations and modifications can be made within the spirit and scope of the present disclosure. Therefore, it is the aspect of the appended claims to cover all such variations and modifications as come within the true spirit and scope of the present disclosure.

What is claimed is:

1. A method for training a shape optimization neural network running on a processor of a computing system, to produce an optimized point cloud defining desired shapes of materials with given properties, wherein the shape optimization neural network includes a first neural network trained for iteratively modifying a shape boundary and a second neural network trained for solving for physical fields by imposing physical constraints expressed in partial differential equations, the method comprising: collecting a subject point cloud including points identified by their initial coordinates and material properties, wherein at least a first subset of the points includes distinct points having different material properties and at least a second subset of the points are on one or more boundaries between different materials; jointly training the first neural network to change coordinates of a set of points in the subject point cloud to maximize an objective function and the second neural network to satisfy the partial differential equations imposed by material properties, physical fields, and physical constraints of the different materials of the subject point cloud having a shape produced by the changed coordinates output by the first neural network; and outputting optimized coordinates of the set of points in the subject point cloud, produced by the trained first neural network; wherein the optimization of coordinates and joint training of the first and second neural networks reduce the number of processing operations on the computing system necessary to optimize a design objective.

2. The method of claim 1, further comprising:

computing a gradient of the objective function in each iteration of the joint training; and back propagating one or more first weights for the first neural network and one or more second weights for the second neural network, based on one or more of the computed gradient, the objective function, or a number of iterations of the joint training violating a stop condition.

3. The method of claim 2, wherein in a current iteration of the joint training, the partial differential equations expressing the physical constraints are scaled with the one or more second weights back propagated in a previous iteration of the joint training.

4. The method of claim 2, wherein the stop condition includes one or more of:

a condition that the gradient of the objective function is smaller than a threshold value;

a condition that the loss function is smaller than a configurable value; or a condition that the number of iterations of the joint training exceeds a maximum threshold.

5. The method of claim 2, wherein the one or more first weights include one or more weights assigned to individual loss components of the objective function that expresses a training loss in terms of residuals from design constraints, and design objectives.

6. The method of claim 2, wherein the one or more second weights include one or more weights assigned to individual loss components of the objective function that expresses a training loss in terms of residuals from strong and weak form governing equations, and boundary conditions.

7. The method of claim 1, wherein the first neural network describes the coordinate change of common points between the first subset of points and the second subset of points.

8. The method of claim 1, wherein the second neural network predicts a physical field for a material of the different materials, and wherein the physical field satisfies the partial differential equations.

9. The method of claim 1, wherein the objective function is defined based on one or more residuals from strong and weak form governing equations, boundary conditions, design constraints, or design objectives for the shape optimization neural network.

10. The method of claim 1, further comprising outputting the physical fields of the different materials produced by the trained second neural network.

11. The method of claim 1, wherein the subject point cloud is collected from a plurality of sensor measurements.

12. A system for training a shape optimization neural network running on a processor of a computing system, to produce an optimized point cloud defining desired shapes of materials with given properties, the system comprising: a memory configured to store computer executable instructions; and one or more processors configured to execute the instructions to: collect a subject point cloud including points identified by their initial coordinates and material properties, wherein at least a first subset of the points includes distinct points having different material properties and at least a second subset of the points are on one or more boundaries between different materials; jointly train i.) a first neural network of the shape optimization neural network to iteratively modify a shape boundary by changing coordinates of a set of points in the subject point cloud to maximize an objective function and ii.) a second neural network of the shape optimization neural network to solve for physical fields by satisfying partial differential equations imposed by material properties, physical fields, and physical constraints of the different materials of the subject point cloud having a shape produced by the changed coordinates output by the first neural network; and output optimized coordinates of the set of points in the subject point cloud, produced by the trained first neural network; wherein the optimization of coordinates and joint training of the first and second neural networks reduce the number of processing operations on the computing system necessary to optimize a design objective.

13. The system of claim 12, further comprising:

computing a gradient of the objective function in each iteration of the joint training; and back propagating one or more first weights for the first neural network and one or more second weights for the second neural network, based on one or more of the computed gradient, the objective function, or a number of iterations of the joint training violating a stop condition.

14. The system of claim 13, wherein in a current iteration of the joint training, the partial differential equations expressing the physical constraints are scaled with the one or more second weights back propagated in a previous iteration of the joint training.

15. The system of claim 13, wherein the stop condition includes one or more of:

a condition that the gradient of the objective function is smaller than a threshold value;

a condition that the loss function is smaller than a configurable value; or a condition that the number of iterations of the joint training exceeds a maximum threshold.

16. The method of claim 13, wherein the one or more first weights include one or more weights assigned to individual loss components of the objective function that expresses a training loss in terms of residuals from design constraints, and design objectives.

17. The method of claim 13, wherein the one or more second weights include one or more weights assigned to individual loss components of the objective function that expresses a training loss in terms of residuals from strong and weak form governing equations, and boundary conditions.

18. The method of claim 12, wherein the first neural network describes the coordinate change of common points between the first subset of points and the second subset of points.

19. The method of claim 12, wherein the second neural network predicts a physical field for a material of the different materials, and wherein the physical field satisfies the partial differential equations.

20. A non-transitory computer readable medium having stored thereon computer executable instructions which when executed by a computer, cause the computer to execute a method for training a shape optimization neural network running on a processor of a computing system, to produce an optimized point cloud defining desired shapes of materials with given properties, the method comprising: collecting a subject point cloud including points identified by their initial coordinates and material properties, wherein at least a first subset of the points includes distinct points having different material properties and at least a second subset of the points are on one or more boundaries between different materials; jointly training i.) a first neural network of the shape optimization neural network to iteratively modify a shape boundary by changing coordinates of a set of points in the subject point cloud to maximize an objective function and ii.) a second neural network of the shape optimization neural network to solve for physical fields by satisfying partial differential equations imposed by material properties, physical fields, and physical constraints of the different materials of the subject point cloud having a shape produced by the changed coordinates output by the first neural network; and outputting optimized coordinates of the set of points in the subject point cloud, produced by the trained first neural network; wherein the optimization of coordinates and joint training of the first and second neural networks reduce the number of processing operations on the computing system necessary to optimize a design objective.

* * * * *